(12) United States Patent
Kim et al.

(10) Patent No.: US 11,069,399 B2
(45) Date of Patent: Jul. 20, 2021

(54) 3-DIMENSIONAL MEMORY DEVICE

(71) Applicant: SAMSUNG ELECTRONICS CO., LTD., Suwon-si (KR)

(72) Inventors: Changbum Kim, Seoul (KR); Sunghoon Kim, Seongnam-si (KR); Seungyeon Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/840,596

(22) Filed: Apr. 6, 2020

(65) Prior Publication Data
US 2020/0381037 A1 Dec. 3, 2020

(30) Foreign Application Priority Data

Jun. 3, 2019 (KR) .................. 10-2019-0065472

(51) Int. Cl.
*G11C 11/408* (2006.01)
*G11C 11/4099* (2006.01)
*G11C 5/02* (2006.01)
*H01L 27/24* (2006.01)

(52) U.S. Cl.
CPC .......... *G11C 11/4085* (2013.01); *G11C 5/025* (2013.01); *G11C 11/4087* (2013.01); *G11C 11/4099* (2013.01); *H01L 27/249* (2013.01)

(58) Field of Classification Search
CPC . G11C 11/4085; G11C 11/4087; G11C 5/025; G11C 11/4099; G11C 2213/71; G11C 11/2257; G11C 11/1657; G11C 8/14; G11C 8/10; G11C 16/08; H01L 27/249; H01L 27/11582; H01L 27/11565; H01L 27/11573; H01L 27/228
See application file for complete search history.

(56) References Cited

U.S. PATENT DOCUMENTS

| 7,420,832 | B1 | 9/2008 | Lukes et al. | |
| 7,529,879 | B2 | 5/2009 | Kim et al. | |
| 8,854,913 | B2 * | 10/2014 | Jang | G11C 16/08 |
| | | | | 365/230.04 |
| 9,196,364 | B2 * | 11/2015 | Kim | G11C 16/08 |
| 9,355,735 | B1 | 5/2016 | Chen et al. | |
| 9,437,300 | B2 | 9/2016 | Kamata et al. | |
| 10,319,738 | B2 * | 6/2019 | Kim | G11C 16/107 |
| 10,615,173 | B2 * | 4/2020 | Kim | H01L 27/11573 |

(Continued)

*Primary Examiner* — Tri M Hoang
(74) *Attorney, Agent, or Firm* — Volentine, Whitt & Francos, PLLC

(57) ABSTRACT

A memory device including a first memory cell array including first memory cells stacked vertically on a first memory cell array region of a top surface of a substrate; a second memory cell array including second memory cells stacked vertically on a second memory cell array region of the top surface; first word lines coupled to the first memory cells and including a subset of first word lines and remaining first word lines; second word lines coupled to the second memory cells and including a subset of second word lines and remaining second word lines; and a row decoder, including a plurality of merge pass transistors each commonly connected to a respective one of the subset of first word lines and a respective one of the subset of second word lines, disposed in a region of the top surface between the first and second cell array regions.

20 Claims, 22 Drawing Sheets

(56) References Cited

U.S. PATENT DOCUMENTS

2012/0257452 A1   10/2012  Kim et al.
2014/0036590 A1    2/2014  Feeley et al.
2015/0078086 A1    3/2015  Lee
2018/0294277 A1*  10/2018  Kim ................... H01L 27/11575
2019/0362792 A1*  11/2019  Oh .................... H01L 27/11565

* cited by examiner

FIG. 8

| M: THE NUMBER OF MERGED WORD LINES<br>N: THE NUMBER OF WORD LINES<br>K: REFERENCE VALUE<br>j: ANY INTEGER | $M \leq N/K$ | $M > N/K$ |
|---|---|---|
| WORD LINE RESISTANCE REFERENCE | $R(\text{of } WL_{M\_PTj}) \geq R(\text{of } WL_{N/K})$ | A1 > A2<br><br>A1: $R(\text{of } WL_{M\_PTj}) \geq R(\text{of } WL_{N/K})$<br>A2: $R(\text{of } WL_{M\_PTj}) < R(\text{of } WL_{N/K})$ |
| CONNECTION LINE RESISTANCE REFERENCE | $R(\text{of } CL_{M\_PTj})/2 \leq R \text{ of } CL_{N/K}$ | B1 > B2<br><br>B1: $R(\text{of } CL_{M\_PTj})/2 \leq R(\text{of } WL_{N/K})$<br>B2: $R(\text{of } CL_{M\_PTj})/2 > R(\text{of } WL_{N/K})$ |

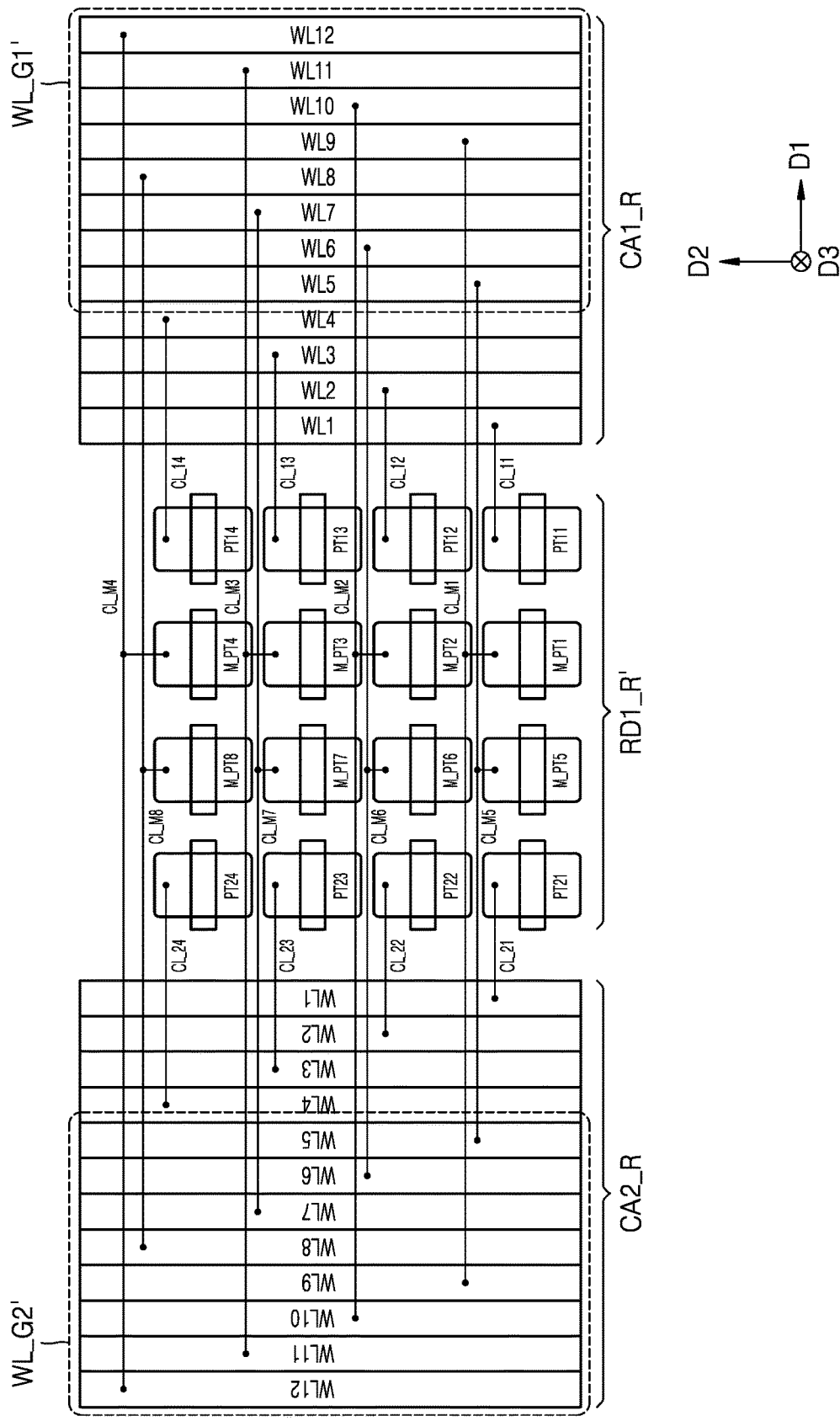

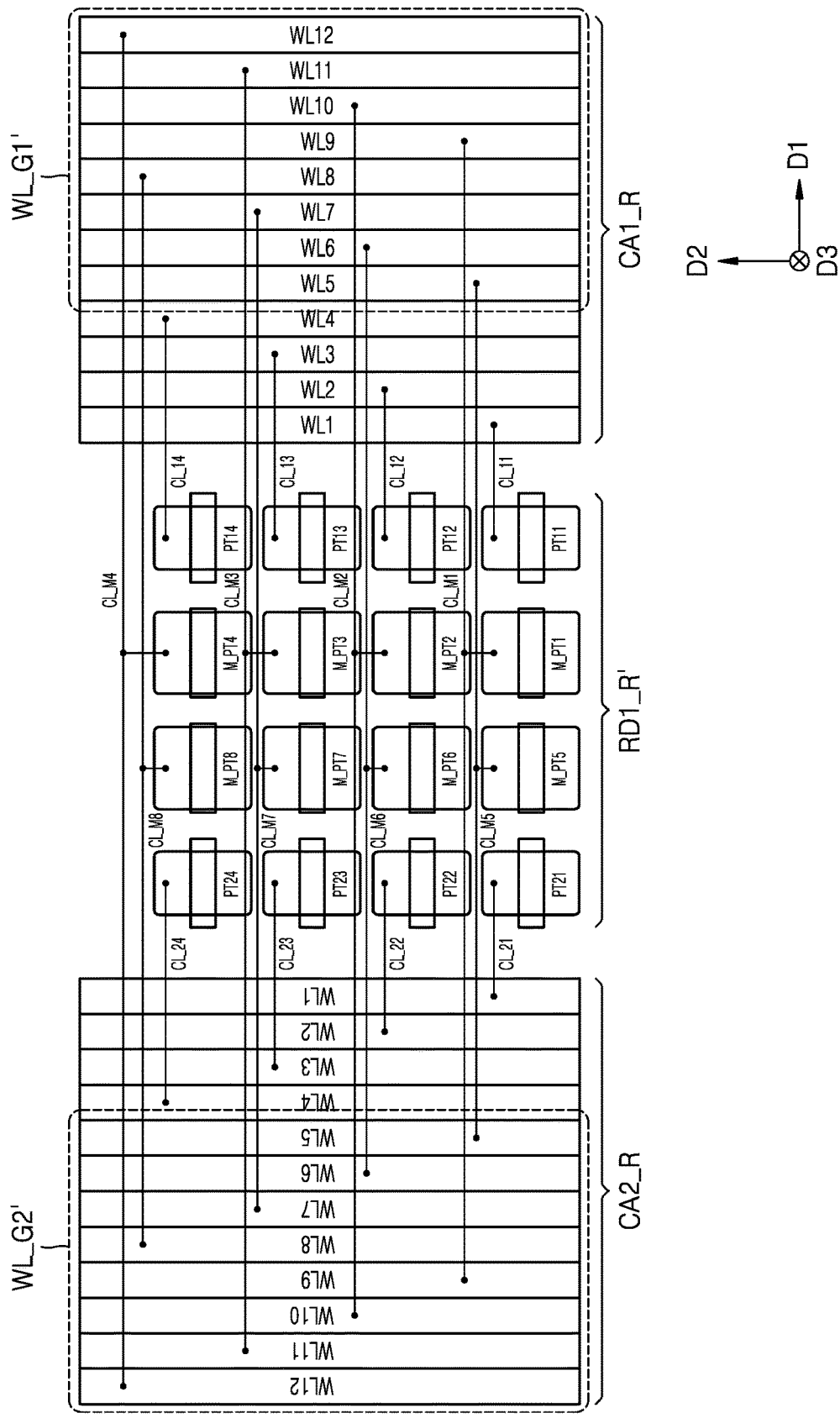

3-DIMENSIONAL MEMORY DEVICE

CROSS-REFERENCE TO RELATED APPLICATIONS

A claim of priority is made to Korean Patent Application Nos. 10-2019-0065472, filed on Jun. 3, 2019, in the Korean Intellectual Property Office, the disclosure of which is incorporated herein in its entirety by reference.

BACKGROUND

The inventive concept relates to a memory device, and more particularly, to a 3-dimensional memory device.

Memory devices are used to store data and are typically categorized as either volatile memory devices which lose data in the absence of power or non-volatile memory devices which retain data in the absence of power. One example of non-volatile memory devices are flash memory devices commonly found in cellular phones, digital cameras, portable digital assistants (PDAs), mobile computer devices, stationary computer devices, and other devices.

3-dimensional (3D) memory devices have been developed to meet contradictory demands of higher memory capacities and miniaturization of non-volatile memory devices. A 3-dimensional memory device is a memory device including a plurality of memory cells or memory cell arrays vertically stacked on a substrate. However, as the number of stacked memory cells is increased, the number of transistors required for controlling the memory cells is dramatically increased. As a result, the space required to arrange the transistors in the 3-dimensional memory device is increased, and thus the overall size of the 3-dimensional memory device increased. This can make it difficult to avoid exceeding the critical size of a memory package including the 3-dimensional memory device.

SUMMARY

The inventive concept provides a 3-dimensional memory device of reduced size through a connection structure between transistors and memory cells and an arrangement structure of transistors.

Embodiments of the inventive concept provide a memory device including a substrate including a top surface; a first memory cell array including first memory cells stacked vertically on a first memory cell array region of the top surface of the substrate; a second memory cell array including second memory cells stacked vertically on a second memory cell array region of the top surface of the substrate; first word lines coupled to the first memory cells, the first word lines including a subset of first word lines and remaining first word lines; second word lines coupled to the second memory cells, the second word lines including a subset of second word lines and remaining second word lines; and a row decoder including a plurality of merge pass transistors, each of the plurality of merge pass transistors commonly connected to a respective one of the subset of first word lines and a respective one of the subset of second word lines, and the row decoder disposed in a row decoder region of the top surface of the substrate between the first cell array region and the second cell array region.

Embodiments of the inventive concept further provide a memory device including a substrate having a top surface; a first memory cell array including a first memory stack including first memory cells stacked vertically on a first memory cell array region of the top surface of the substrate; a second memory cell array including a second memory stack including second memory cells stacked vertically on a second memory cell array region of the top surface of the substrate; first word lines coupled to the first memory cells, the first word lines including a subset of first word lines and remaining first word lines; second word lines coupled to the second memory cells, the second word lines including a subset of second word lines and remaining second word lines; a plurality of first merge pass transistors arranged in a region between the first memory cell array region and the second memory cell array region, each of the plurality of first merge pass transistors commonly connected to a respective one of the subset of first word lines and a respective one of the subset of second word lines; a plurality of first pass transistors arranged adjacent to the first memory cell array region and respectively coupled to the remaining first word lines; and a plurality of second pass transistors arranged adjacent to the second memory cell array region and respectively coupled to the remaining second word lines.

Embodiments of the inventive concept still further provide a memory device including a substrate including a top surface; a first memory cell array including memory cells stacked vertically on a first memory cell array region on the top surface of the substrate; a second memory cell array including memory cells stacked vertically on a second memory cell array region on the top surface of the substrate; first word lines and first selection lines coupled to the first memory cell array, the first word lines including a subset of first word lines and remaining first word lines, and the first selection lines including a subset of first selection lines and remaining first selection lines; second word lines and second selection lines coupled to the second memory cell array, the second word lines including a subset of second word lines and remaining second word lines, and the second selection lines including a subset of second selection lines and remaining second selection lines; and a row decoder including a plurality of first merge pass transistors, each of the plurality of first merge pass transistors commonly connected to a respective one of the subset of first word lines and a respective one of the subset of second word lines, and a plurality of second merge pass transistors, each of the plurality of second merge pass transistors commonly connected to a respective one of the subset of first selection lines and a respective one of the subset of second selection lines, the row decoder disposed in a row decoder region between the first cell array region and the second cell array region.

BRIEF DESCRIPTION OF THE DRAWINGS

Embodiments of the inventive concept will be more clearly understood from the following detailed description taken in conjunction with the accompanying drawings in which:

FIG. 8 is a table showing conditions of word lines to which merge pass transistors are coupled according to example embodiments of the inventive concept;

FIGS. 10A, 10B and 10C are diagrams for describing a connection structure of a plurality of merge pass transistors and a plurality of pass transistors to word lines according to example embodiments of the inventive concept;

DETAILED DESCRIPTION OF THE EMBODIMENTS

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
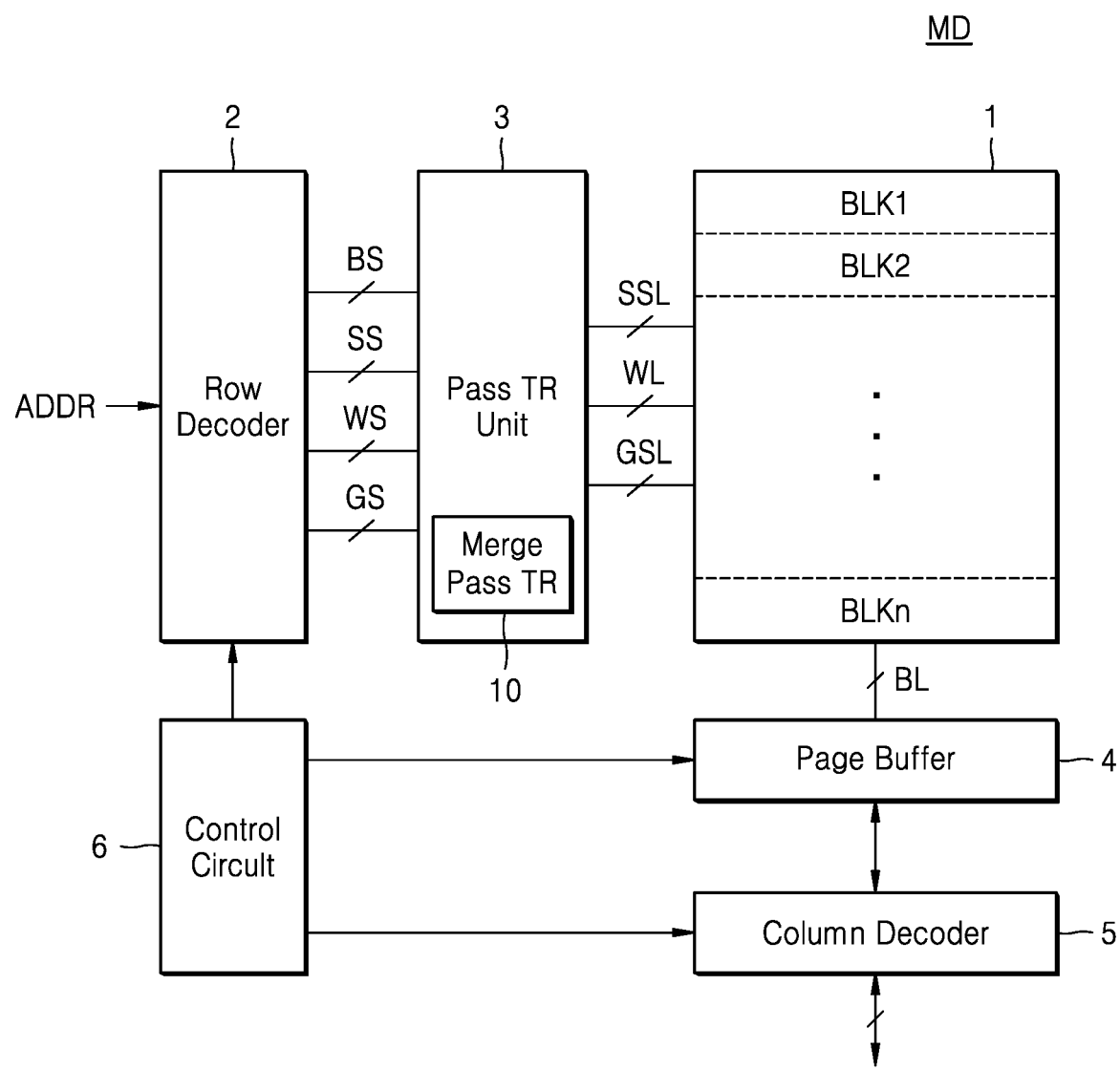
FIG. 1 is a block diagram showing the schematic configuration of a memory device MD according to an embodiment of the inventive concept.

FIG. 1 is a block diagram showing the schematic configuration of a memory device MD according to an embodiment of the inventive concept.

Referring to FIG. 1, the memory device MD may include a memory cell array 1, a row decoder 2, a pass transistor (TR) unit 3, a page buffer 4, a column decoder 5, and a control circuit 6. Hereinafter, the memory device MD is assumed to be a non-volatile memory device, wherein the memory cell array 1 may be a non-volatile memory including a flash memory, a magnetic random access memory (MRAM), a resistance random access memory (ReRAM), a ferroelectric random access memory (FRAM), or the like, Hereinafter, it will be assumed that the memory device MD is a 3-dimensional flash memory device. However, the assumptions here are merely examples, and the inventive concept is not limited thereto. The memory cell array 1 includes a plurality of memory blocks BLK1 to BLKn, and each of the memory blocks BLK1 to BLKn may include a plurality of memory cells that are 3-dimensionally arranged, and a plurality of word lines WL and a plurality of bit lines BL that are electrically coupled to the memory cells, respectively.

The row decoder 2 and pass TR unit 3 may select any one of the memory blocks BLK1 to BLKn by decoding an externally supplied address ADDR, and selecting any one of the word lines WL of a selected memory block. The decoder 2 and pass TR unit 3 may be commonly coupled to the memory blocks BLK1 to BLKn and may provide drive signals (a string selection signal SS, a ground selection signal GS, and a word line signal WS) generated by a voltage generating circuit (not shown) to the word lines WL and selection lines (a ground selection line GSL and a string selection line SSL) of a memory block selected according to a block selection signal BS.

The pass TR unit 3 may be coupled to the memory cell array 1 through the word lines WL and selection lines SSL and GSL. The pass TR unit 3 may be controlled by the block selection signal BS provided from the row decoder 2. The pass TR unit 3 may transmit word line signals WS and selection signals SS and GS to the word lines WL and the selection lines SSL and GSL of the selected memory block.

The memory cell array 1 may include 3-dimensional flash memory cells. As the word line signals WS, a program voltage, a read voltage, a pass voltage, and a verify voltage generated by a voltage generator (not shown) may be provided to the word lines WL. For example, the program voltage may be a relatively high voltage compared to the read voltage, the pass voltage, and the verify voltage, and the pass TR unit 3 may include pass transistors capable of withstanding high voltages.

The pass TR unit 3 according to an embodiment of the inventive concept may further include a plurality of merge pass transistors 10. The merge pass transistors 10 may be coupled to two different word lines to merge the two different word lines. The memory cell array 1 may be divided into a plurality of memory cell arrays. For example, the memory cell array 1 may be divided into a first memory cell array and a second memory cell array. Although the first memory cell array and the second memory cell array are structurally apart from each other, the first memory cell array and the second memory cell array may operate as the one memory cell array 1 during a memory operation. For example, the merge pass transistors 10 may be coupled to some of a plurality of word lines of the first memory cell array and some of a plurality of word lines of the second memory cell array. Also, the merge pass transistors 10 according to an example embodiment may be coupled to two different selection lines and merge the two different selection lines. For example, the merge pass transistors 10 may be coupled to some of a plurality of selection lines of the first memory cell array and some of a plurality of selection lines of the second memory cell array. Through the merge pass transistors 10, the first memory cell array and the second memory cell array may be electrically coupled to each other at the same time. Detailed examples of the merge pass transistors 10 will be described later.

As such, the space for disposing the pass TR unit 3 may be minimized by reducing the number of pass transistors of the pass TR unit 3 including the merge pass transistors 10 according to an example embodiment of the inventive concept. As a result, the size of the memory device MD may be reduced.

The page buffer 4 may be coupled to the memory cell array 1 through the bit lines BL and read information stored in memory cells. The page buffer 4 may be coupled to a bit line selected according to an address decoded by the column decoder 5. The page buffer 4 may temporarily store data to be stored in the memory cells or detect data stored in the memory cells according to an operation mode. For example, the page buffer 4 may operate as a write driver circuit in a program operation mode and may operate as a sense amplifier circuit in a read operation mode. The page buffer 4 may receive power (e.g., a voltage or a current) from the control circuit 6 and provide the same to a selected bit line.

The column decoder 5 may provide a data transfer path between the page buffer 4 and an external device (e.g., a memory controller). The column decoder 5 may select any one of bit lines by decoding an externally input address. The column decoder 5 is commonly coupled to the memory blocks BLK1 to BLKn and may provide data information to bit lines of a memory block selected according to the block selection signal BS.

The control circuit 6 may control the overall operation of the memory device MD. The control circuit 6 may receive a control signal and an external voltage and operate according to the received control signal. The control circuit 6 may include a voltage generator for generating voltages (e.g., a program voltage, a read voltage, an erase voltage, etc.) needed for internal operations by using an external voltage. The control circuits 6 may control a program operation, a read operation, and an erase operation in response to control signals.

Although FIG. 1 shows that the row decoder 2 and the pass TR unit 3 are separately provided, the illustrated embodiment is merely an example, and the inventive concept is not limited thereto. For example, the row decoder 2 may be configured to include the pass TR unit 3. Accordingly, the pass TR unit 3 may also be disposed in a region where the row decoder 2 is disposed. Hereinafter, an arrangement structure of the merge pass transistor 10 will be described based on a region in which the row decoder 3 and the pass TR unit 3 are disposed together. However, the described arrangements are merely for convenience of explanation, and it is clear that the arrangement structure of the merge pass transistor 10 according to embodiments of the inventive concept may be applied to various configurations of the row decoder 3.

Figure 2:
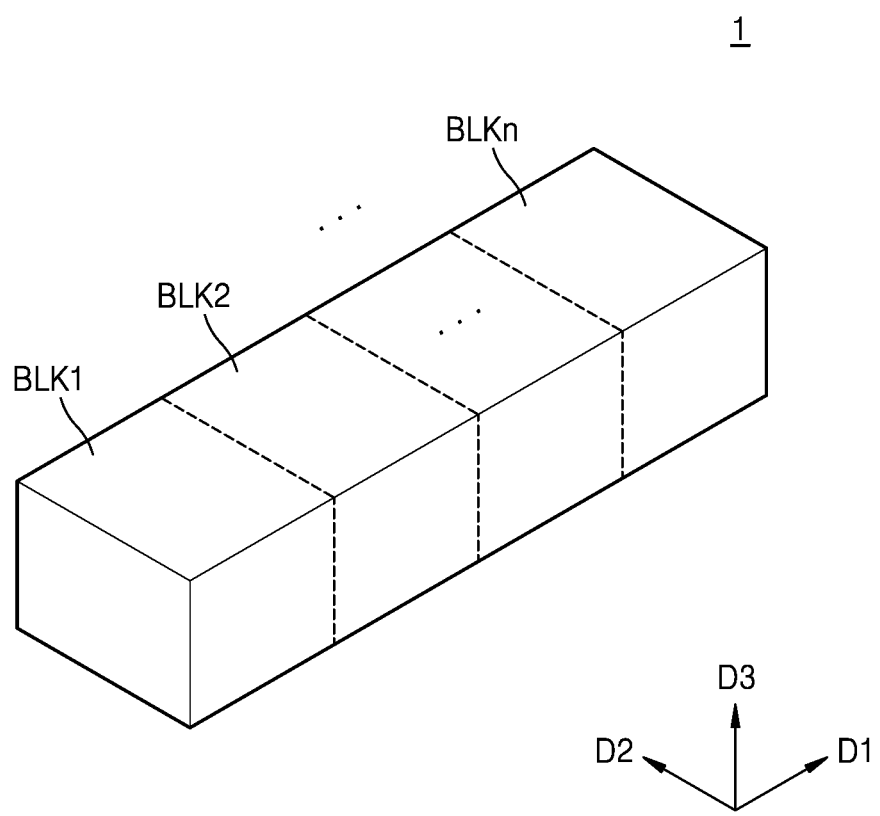
FIG. 2 is a schematic block diagram of a memory cell array of a memory device according to an example embodiment of the inventive concept.

FIG. 2 is a schematic block diagram of a memory cell array of a memory device according to an example embodiment of the inventive concept.

Referring to FIG. 2, a memory cell array 1 may include a plurality of memory blocks BLK1 to BLKn. Each of the memory blocks BLK1 to BLKn may include an electrode structure including word lines stacked in a third direction D3 on a plane extending in a first horizontal direction D1 and a second horizontal direction D2. Here, the word lines of the electrode structure may be combined with a plurality of vertical semiconductor pillars and constitute 3-dimensionally arranged memory cells. Also, each of the memory blocks BLK1 to BLKn may include bit lines electrically coupled to the memory cells. Each of the memory blocks BLK1 to BLKn may include at least one memory stack. In an embodiment, the merge pass transistors 10 of FIG. 1 may be coupled to particular word lines within one memory stack. Also, when each of the memory blocks BLK1 to BLKn includes a plurality of memory stacks, the merge pass transistors 10 of FIG. 1 may be coupled to particular word lines of each memory stack. Detailed embodiments thereof will be described later herein.

Figure 3:
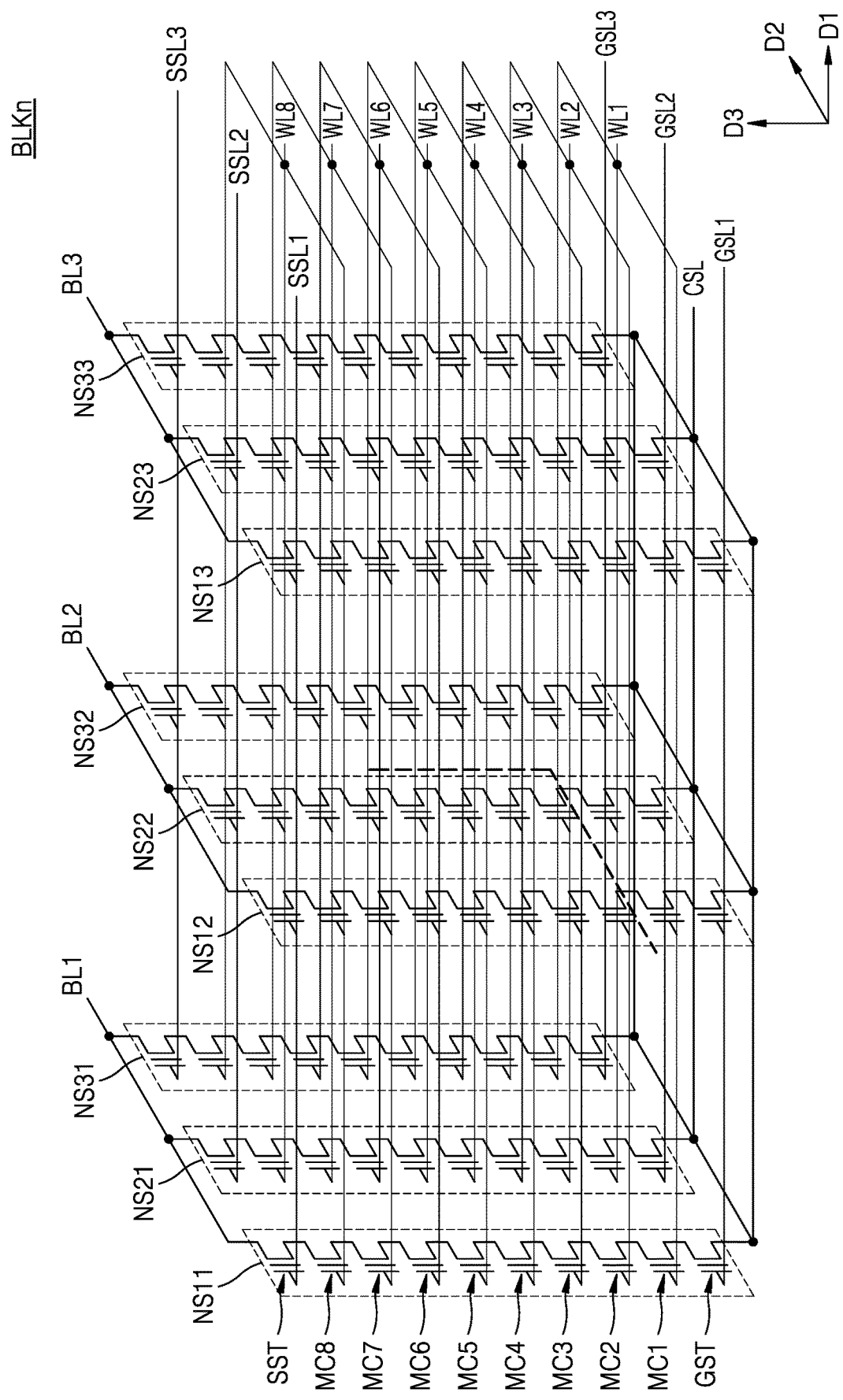
FIG. 3 is a circuit diagram showing another example of a memory block included in a memory cell array according to an example embodiment of the inventive concept.

FIG. 3 is a circuit diagram showing another example of a memory block BLKn included in a memory cell array according to an example embodiment of the inventive concept.

Referring to FIG. 3, a memory cell array (e.g., the memory cell array 1 of FIG. 1) may be a memory cell array of a vertical NAND flash memory and may include a plurality of memory blocks. FIG. 3 shows an example in which eight word lines WL1 to WL8 are provided in one memory block BLKn. A memory block BLKn may include a plurality of NAND cell strings NS11 to NS33, a plurality of word lines WL1 to WL8, a plurality of bit lines BL1 to BL3, a plurality of ground select lines GSL1 to GSL3, a plurality of string select lines SSL1 to SSL3, and a common source line CSL. Here, the number of NAND cell strings, the number of word lines, the number of bit lines, the number of ground selection lines, and the number of cell string selection lines may vary.

NAND cell strings NS11, NS21, and NS31 are provided between a first bit line BL1 and the common source line CSL, NAND cell strings NS12, NS22, and NS32 are provided between a second bit line BL2 and the common source line CSL, and NAND cell strings NS13, NS23, and NS33 are provided between a third bit line BL3 and the common source line CSL. Each NAND cell string (e.g., NS11) may include a cell string select transistor SST, a plurality of memory cells MC1 to MC8, and a ground select transistor GST that are coupled in series.

Cell strings commonly coupled to one bit line constitute one column. For example, the NAND cell strings NS11, NS21, and NS31 commonly coupled to the first bit line BL1 may constitute a first column, the NAND cell strings NS12, NS22, and NS32 commonly coupled to the second bit line BL2 may constitute a second column, and the NAND cell strings NS13, NS23, and NS33 commonly coupled to the third bit line BL3 may constitute a third column.

NAND cell strings coupled to one cell string selection line constitute one row. For example, NAND cell strings NS11, NS12, and NS13 coupled to a first cell string selection line SSL1 may constitute a first row, NAND cell strings NS21, NS22, and NS23 coupled to a second cell string selection line SSL2 may constitute a second row, and NAND cell strings NS31, NS32, and NS33 coupled to a third cell string selection line SSL3 may constitute a third row.

The cell string select transistors SST are coupled to a corresponding string select line SSL1, SSL2, or SSL3. The memory cells MC1 to MC8 are coupled to corresponding word lines WL1 to WL8, respectively. The ground select transistors GST are coupled to a corresponding ground select line GSL1, GSL2, or GSL3. The cell string select transistors SST are respectively coupled to a corresponding bit line BL1, BL2, or BL3, and the ground select transistor GST is coupled to the common source line CSL.

Word lines of the same height in the direction D3 (e.g., WL1) are coupled to each other in common, the cell string selection lines SSL1 to SSL3 are separated from one another, and the ground selection lines GSL1 to GSL3 are also separated from one another. For example, when programming memory cells coupled to a first word line WL1 and belonging to the NAND cell strings NS11, NS12, and NS13, the first word line WL1 and the first cell string selection line SSL1 are selected. The ground selection lines GSL1 to GSL3 may be coupled to one another in common.

Figure 4:
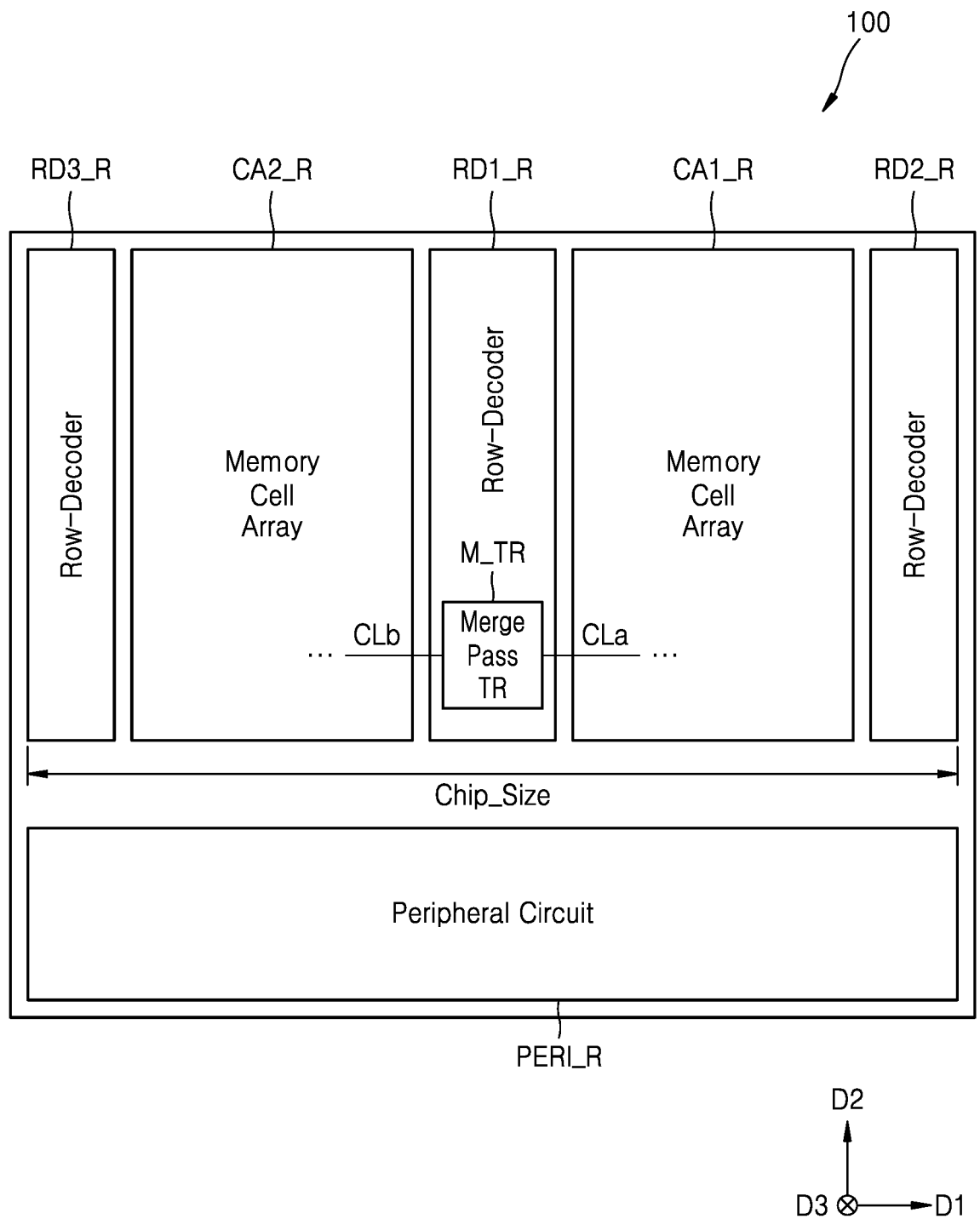
FIG. 4 is a layout diagram for describing an arrangement of components included in a memory device according to an example embodiment of the inventive concept.

FIG. 4 is a layout diagram for describing an arrangement of components included in a memory device 100 according to an example embodiment of the inventive concept.

Referring to FIG. 4, the memory device 100 may be implemented on a semiconductor chip, and the semiconductor chip may include memory cell array regions CA1_R and CA2_R, row decoder regions RD1_R, RD2_R, and RD3_R, and a peripheral circuit region PERI_R. Memory cell arrays, which are vertical stacked structures, may be arranged in the memory cell array regions CA1_R and CA2_R. The row decoder regions RD1_R, RD2_R, and RD3_R are adjacent to the memory cell array regions CA1_R and CA2_R in the first horizontal direction D1, and row decoders may be arranged in the row decoder regions RD1_R, RD2_R, and RD3_R. The peripheral circuit region PERI_R is adjacent to the memory cell array regions CA1_R and CA2_R and the row decoder regions RD1_R, RD2_R, and RD3_R in the second horizontal direction D2, and, in the peripheral circuit region PERI_R, a page buffer and a data input/output circuit may be arranged.

The memory cell arrays arranged in the memory cell array regions CA1_R and CA2_R are spaced apart from each other by a certain distance, but the memory cell arrays may be controlled as one memory cell array through row decoders and peripheral circuits for a memory operation.

A first row decoder region RD1_R according to an example embodiment may include a pass TR unit that includes a merge pass transistor M_TR described above in connection with FIG. 1. The first row decoder region RD1_R may be a region located between a first memory cell array region CA1_R and a second memory cell array region CA2_R. The merge pass transistor M_TR may be coupled to any one of a plurality of word lines of a first memory cell array disposed in the first memory cell array region CA1_R and any one of a plurality of word lines of a second memory cell array disposed in the second memory cell array region CA2_R through connection wires CLa and CLb. The first row decoder region RD1_R may include a plurality of merge pass transistors M_TR, and thus, some of the word lines of a first memory cell array and some of the word lines of a second memory cell array may be merged by the merge pass transistors M_TR. Also, in the first row decoder region RD1_R, a plurality of first pass transistors coupled to others of the word lines of the first memory cell array and a plurality of second devices coupled to others of the word lines of the second memory cell array may be further arranged.

According to another example embodiment, in the first row decoder region RD1_R, a first pass transistor and a second pass transistor are not separately disposed, and only the merge pass transistors M_TR are arranged. Therefore, the same word lines in a third direction D3 may be merged with each other from among a plurality of word lines in the first memory cell array and a plurality of word lines in the second memory cell array.

According to another example embodiment, the merge pass transistors M_TR may be coupled to any one of a plurality of selection lines of the first memory cell array and any one of a plurality of selection lines of the second memory cell array through connection wires CLa and CLb. For example, the merge pass transistors M_TR may be coupled to a cell string selection line of the first memory cell array and a cell string selection line of the second memory cell array. Also, the merge pass transistors M_TR may be coupled to a ground string selection line of the first memory cell array and a ground string selection line of the second memory cell array. The first row decoder region RD1_R may include the merge pass transistors M_TR, and thus, some of the selection lines of the first memory cell array and some of the selection lines of the second memory cell array may be merged by the merge pass transistors M_TR.

According to another example embodiment, the merge pass transistors M_TR may be coupled to a dummy word line of the first memory cell array and a dummy word line of the second memory cell array through the connection wires CLa and CLb.

As such, the memory device 100 according to an example embodiment of the inventive concept may include the merge pass transistors M_TR capable of merging word lines, cell string selection lines, ground selection lines, and dummy word lines of the memory cell arrays arranged in the memory cell regions CA1_R and CA2_R adjacent to each other. Hereinafter, an embodiment in which the merge pass transistors M_TR merge word lines will be described, but the inventive concept is not limited thereto. It is clear that the inventive concept may also be applied to structures in which selection lines (cell string select lines or ground selection lines) or dummy word lines are merged.

The overall chip size may be reduced by reducing the number of needed pass transistors through the merge pass transistors M_TR of FIG. 4.

Figure 5:
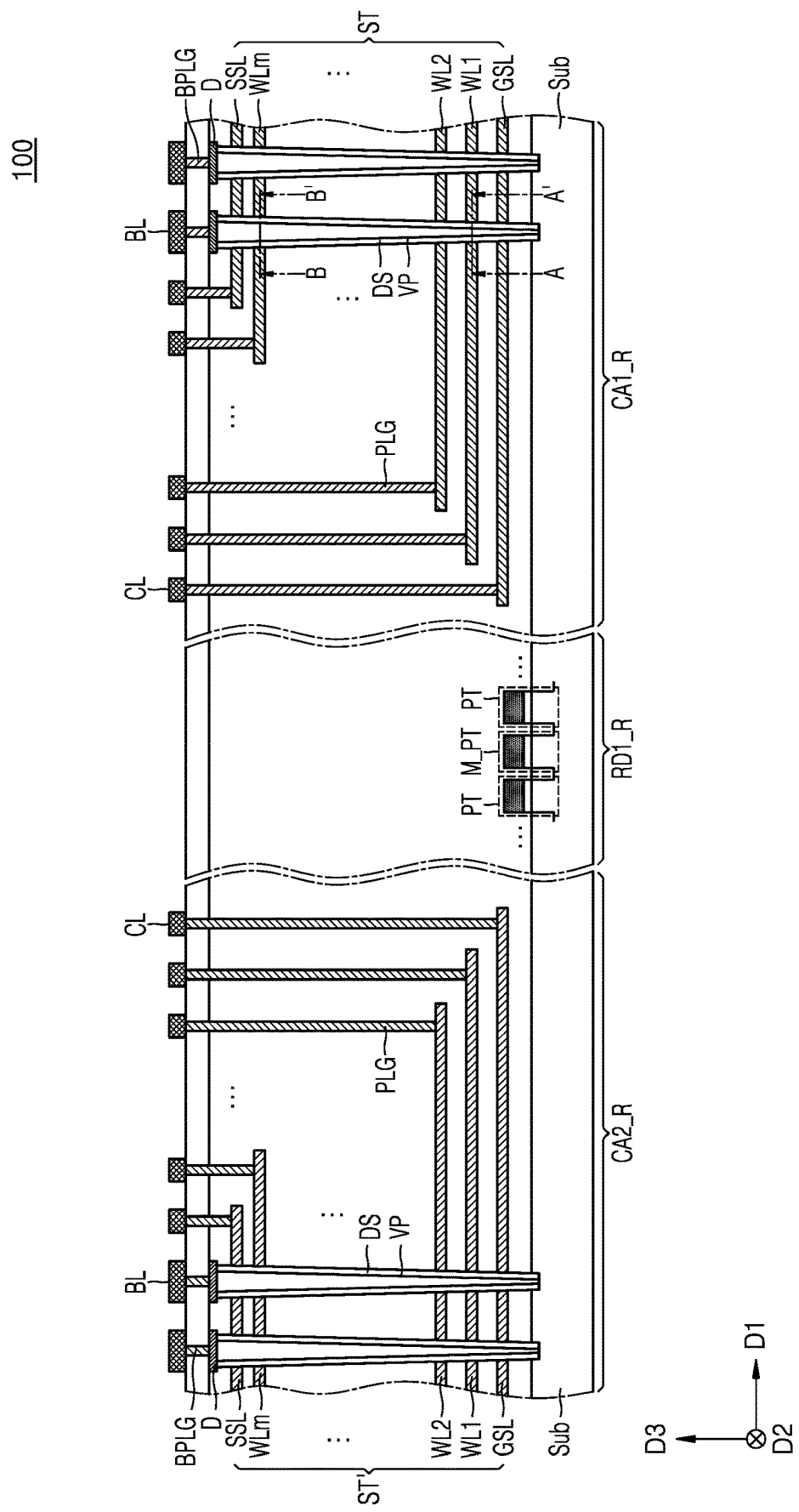
FIG. 5 is a schematic cross-sectional view of a memory device according to an example embodiment of the inventive concept.

FIG. 5 is a schematic cross-sectional view of the memory device 100 according to an example embodiment of the inventive concept.

Referring to FIGS. 4 and 5, a substrate Sub may include a first memory cell array region CA1_R and the first row decoder region RD1_R. The substrate Sub may include any one of a material having a semiconductor property (e.g., a silicon wafer) and a semiconductor or a conductor covered by an insulation material (e.g., glass). For example, the substrate Sub may include a silicon wafer.

Figure 7A:
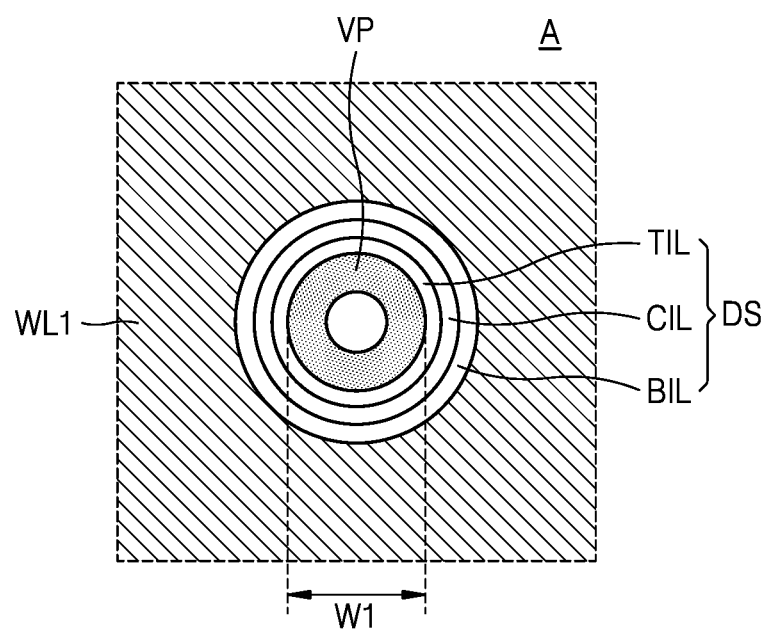
FIGS. 7A and 7B are diagrams showing planes along lines A-A' and B-B' of FIG. 5.
Figure 7B:
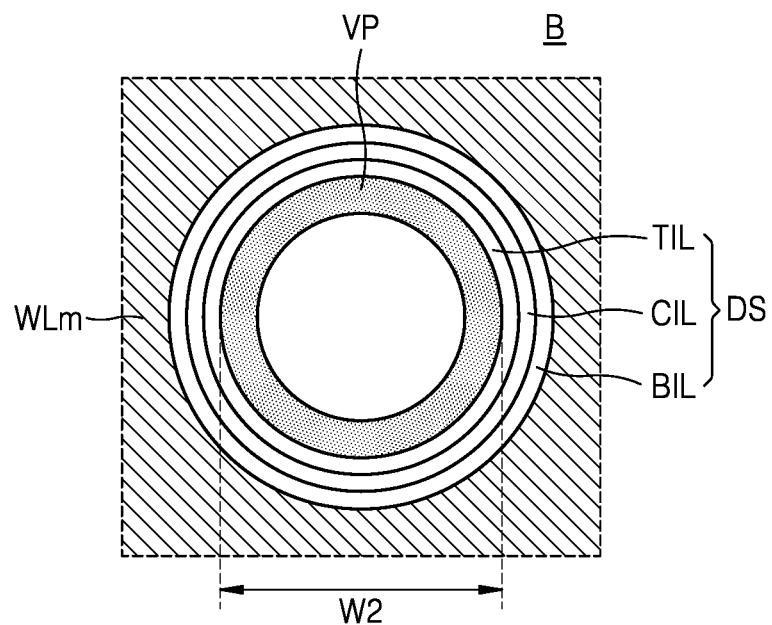

A plurality of pass transistors PT and a plurality of merge pass transistors M_PT may be arranged in the first row decoder region RD1_R. A first memory cell array including a cell array structure may be disposed on the first memory cell array region CA1_R of the substrate Sub. The cell array structure may include an electrode structure ST, vertical semiconductor pillars VP penetrating through the electrode structure ST, a data storage layer DS disposed between the electrode structure ST and the vertical semiconductor pillars VP, and bit lines BL that extend across the electrode structure ST and are coupled to the vertical semiconductor pillars VP. Referring to FIGS. 7A and 7B which will be subsequently described in more detail, the data storage layer DS may include a tunnel insulation layer TIL, a charge storage layer CIL, and a blocking insulation layer BIL.

In more detail, the electrode structure ST may extend in the first horizontal direction D1 and may include a plurality of electrodes and insulation layers that are alternately stacked vertically on the substrate 10. Electrodes of the electrode structure ST may include a cell string selection line SSL, a ground selection line GSL, and word lines WL1 to WLm stacked in the third direction D3.

In some embodiments, to enable electrical connection of the word lines WL1 to WLm and selection lines GSL and SSL of the electrode structure ST to the pass transistors PT and merge pass transistors M_PT of the first row decoder region RD1_R, the electrode structure ST may have a stepped structure descending from the first memory cell array region CA1_R toward the first row decoder region RD1_R. In other words, the height of the electrode structure ST may decrease in the direction from the first memory cell array region CA1_R to the first row decoder region RD1_R, and lengths of the word lines WL1 to WLm and the selection lines GSL and SSL may decrease as distances from the substrate Sub increase.

In some embodiments, the vertical semiconductor pillars VP may penetrate through the electrode structure ST and be electrically coupled to the substrate Sub. In other words, the vertical semiconductor pillars VP may extend in the third direction D3 perpendicular to the top surface of the substrate Sub. The vertical semiconductor pillars VP include a semiconductor material (e.g., silicon) and may be used as channels of the ground selection transistors GST, the cell string selection transistors SST, and the memory cells MC1 to MC8 described above with reference to FIG. 3.

The vertical semiconductor pillars VP may be formed by anisotropic ally etching the vertically stacked films to form holes therethrough, and by depositing semiconductor films in the holes. Since the vertical semiconductor pillars VP are formed in the holes penetrating through the vertically stacked films, the vertical semiconductor pillars VP may have a width (or a diameter) that increases in the upward direction (i.e., the third direction D3). Detailed description of the width (or the diameter) of the vertical semiconductor pillars VP will be given below with reference to FIGS. 7A to 7D, and detailed description of a connection structure of the merge pass transistors M_TR according to the structural characteristics of the vertical semiconductor pillars VP will be given below with reference to FIG. 9.

The bit lines BL may extend in the second horizontal direction D2 across the electrode structure ST. The bit lines BL may be electrically coupled to the vertical semiconductor pillars VP through bit line contact plugs BPLG and a conductive pad D. Contact plugs PLG may be coupled to the word lines WL1 to WLm and the selection lines GSL and SSL, respectively, wherein the lengths of the contact plugs PLG may be different from one another. Connection wires CL may be coupled to the contact plugs PLG, respectively. The connection wires CL may be coupled to a merge pass transistors M_PT or the pass transistors PT of the first row decoder region RD1_R, respectively. Although not shown, the connection wires CL may include connection wires extending in the first horizontal direction D1 to be coupled to the merge pass transistors M_PT or the pass transistors PT. The vertical semiconductor pillars VP may have a U-like shape and may be filled with an insulation material. In another embodiment, the vertical semiconductor pillars VP may have a cylindrical pillar-like shape. The vertical semiconductor pillars VP may include the conductive pad D for electrical connection with the bit lines BL.

The electrode structure ST may constitute one memory stack structure, and, although not shown in FIG. 5, at least one electrode structure ST may be stacked on the electrode structure ST and constitute a multi-memory stack structure. Hereinafter, the merge pass transistors M_PT that merge word lines of memory cell arrays each having one memory stack structure will be described. However, this is merely an example, and the inventive concept is not limited thereto. The merge pass transistors M_PT may merge word lines of memory cell arrays having a multi-memory stack structure for each memory stack. Detailed descriptions thereof will be given below.

An electrode structure ST' having a shape symmetrical with respect to the electrode structure ST in the third direction D3 may be disposed in the second memory cell array region CA2_R. Since the structure of the electrode structure ST' of the second memory cell array disposed in the second memory cell array region CA2_R is the same as that of the electrode structure ST of the first memory cell array, detailed description thereof will be omitted. An example of connection and arrangement of the merge pass transistors M_PT will be described below with reference to the structure of the memory device 200 shown in FIG. 5.

FIGS. 6A, 6B, 6C and 6D are diagrams showing a connection structure of the merge pass transistor M_PT and pass transistors PT1 to PT4 to word lines according to example embodiments of the inventive concept.

Figure 6A:
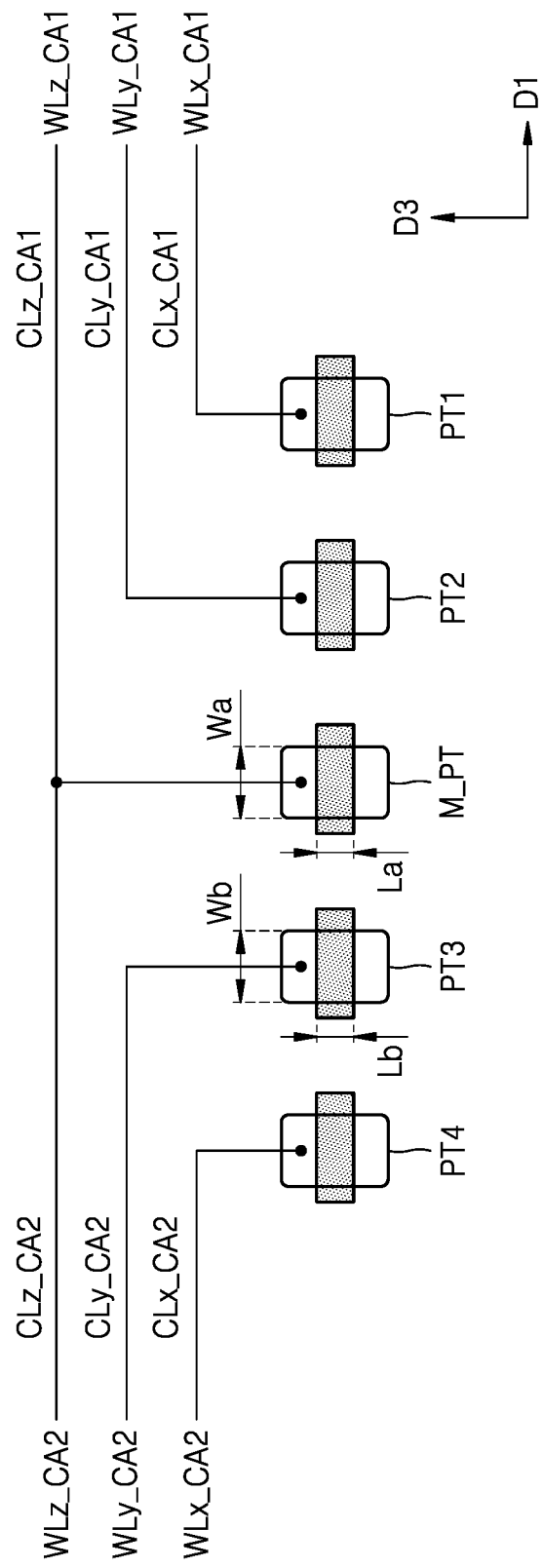
FIGS. 6A, 6B, 6C and 6D are diagrams showing a connection structure of a merge pass transistor and pass transistors to word lines according to example embodiments of the inventive concept.

Referring to FIGS. 4 and 6A, the merge pass transistor M_PT and the pass transistors PT1 to PT4 may be arranged in the first row decoder region RD1_R. The merge pass transistor M_TR may be coupled to a z-th word line WLz_CA1 of the first memory cell array disposed in the first memory cell array region CA1_R and a z-th word line WLz_CA2 of the second memory cell array disposed in the second memory cell array region CA2_R. According to an embodiment, the height of the z-th word line WLz_CA1 of the first memory cell array in the third direction D3 may be the same as the height of the z-th word line WLz_CA2 of the second memory cell array in the third direction D3.

A first pass transistor PT1 may be coupled to an x-th word line WLx_CA1 of the first memory cell array, and a second pass transistor PT2 may be coupled to a y-th word line WLy_CA1 of the first memory cell array. The first pass transistor PT1 and the second pass transistor PT2 may be disposed in a region relatively close to the first memory cell array region CA1_R based on a region in which the merge pass transistor M_PT is disposed.

A third pass transistor PT3 may be coupled to a y-th word line WLy_CA2 of the second memory cell array, and a fourth pass transistor PT4 may be coupled to an x-th word line WLx_CA1 of the first memory cell array. The third pass transistor PT3 and the fourth pass transistor PT4 may be disposed in a region relatively close to the second memory cell array region CA2_R based on the region in which the merge pass transistor M_PT is disposed.

The merge pass transistor M_PT and the pass transistors PT1 to PT4 may be coupled to word lines WLx_CA1 to WLz_CA1 of the first memory cell array and word lines WLx_CA2 to WLz_CA2 of the second memory cell array through connection wires CLx_CA1 to CLz_CA1 and CLx_CA2 to CLz_CA2, respectively.

A gate width Wa and a gate length La of the merge pass transistor M_PT according to an example embodiment may be the same as a gate width Wb and a gate length Lb of the pass transistors PT1 to PT4. Therefore, the merge pass transistor M_PT may have the same signal gain or driving performance as that of the pass transistors PT1 to PT4.

Although FIG. 6A shows that four pass transistors PT1 to PT4 and one merge pass transistor M_PT are arranged along a line in the first horizontal direction D1 in a first row decoder region RD1_R, this is merely an example, and the inventive concept is not limited thereto. In the first horizontal direction D1, more merge pass transistors M_PT may be disposed and fewer or more pass transistors PT may be disposed.

Figure 6B:
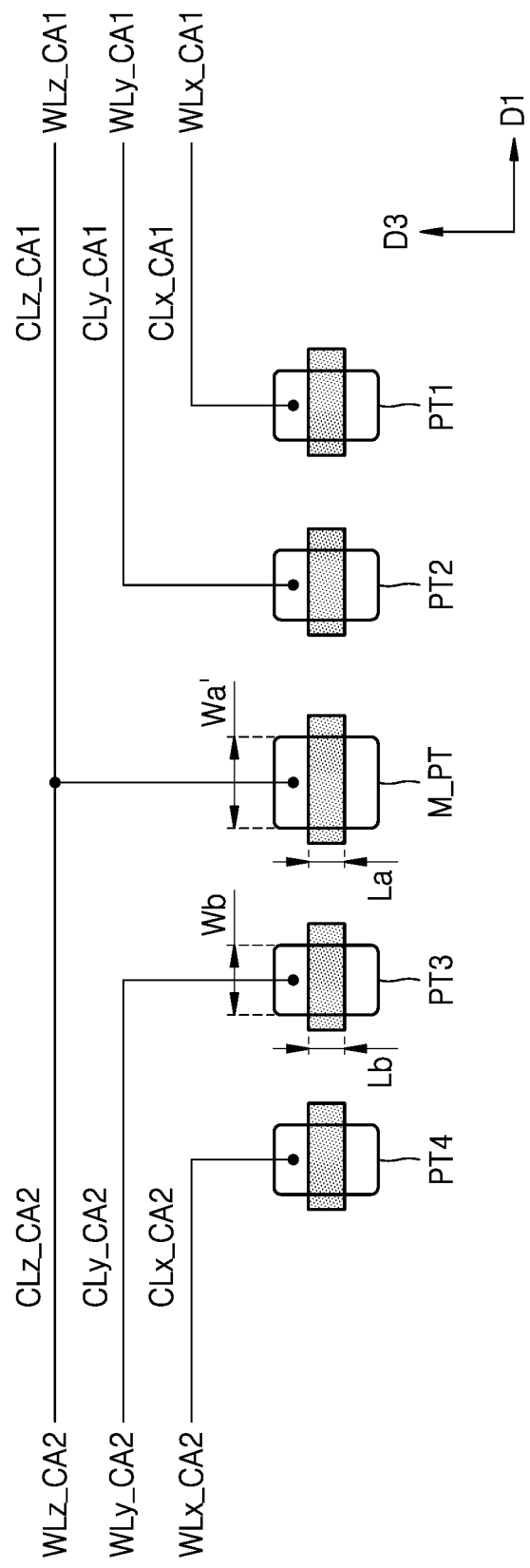

Referring to FIG. 6B, a gate width Wa' of the merge pass transistor M_PT may be greater than the gate width Wb of the pass transistors PT1 to PT4, and the gate length La of the merge pass transistor M_PT may be the same as the gate length Lb of the pass transistors PT1 to PT4. Therefore, the merge pass transistor M_PT may have higher signal gain or driving performance than that of the pass transistors PT1 to PT4.

Figure 6C:
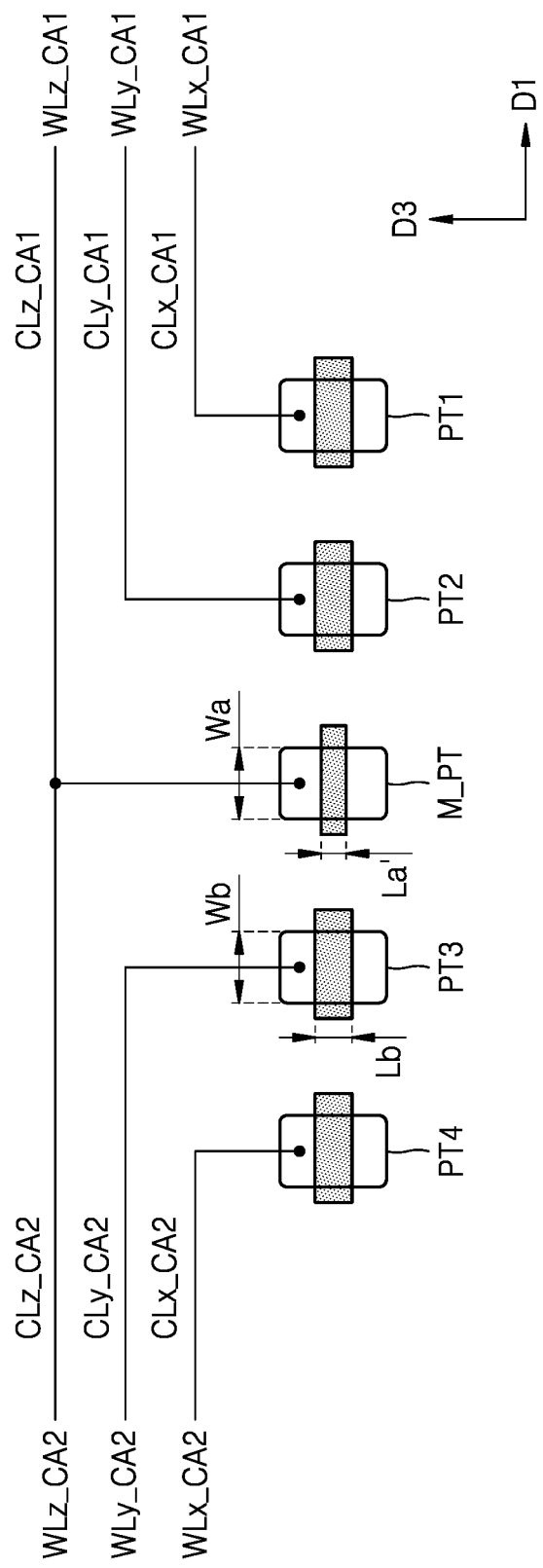

Referring to FIG. 6C, a gate length La' of the merge pass transistor M_PT may be less than the gate length Lb of the pass transistors PT1 to PT4, and the gate width Wa of the merge pass transistor M_PT may be the same as the gate width Wb of the pass transistor PT1 to PT4. Therefore, the merge pass transistor M_PT may have higher signal gain or driving performance than that of the pass transistors PT1 to PT4.

Figure 6D:
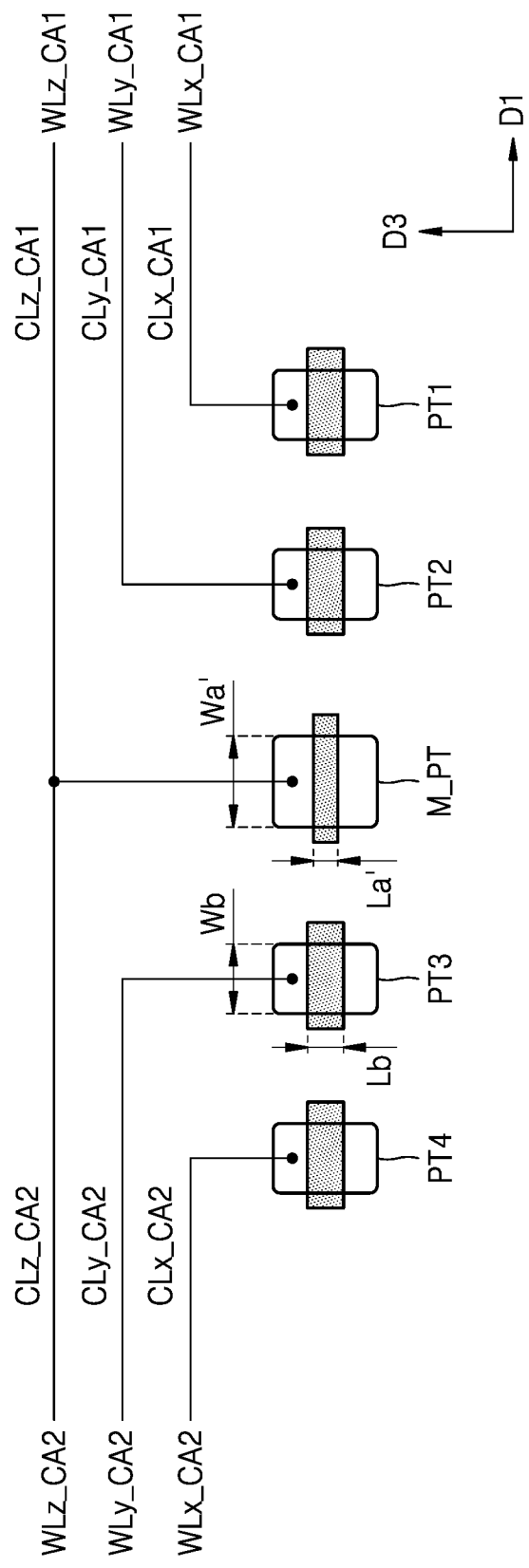

Referring to FIG. 6D, a gate width Wa' and a gate length La' of the merge pass transistor M_PT may be different from the gate width Wb and the gate length Lb of the pass transistors PT1 to PT4, respectively. Therefore, the merge pass transistor M_PT may have higher signal gain or driving performance than that of the pass transistors PT1 to PT4.

Figure 7C:
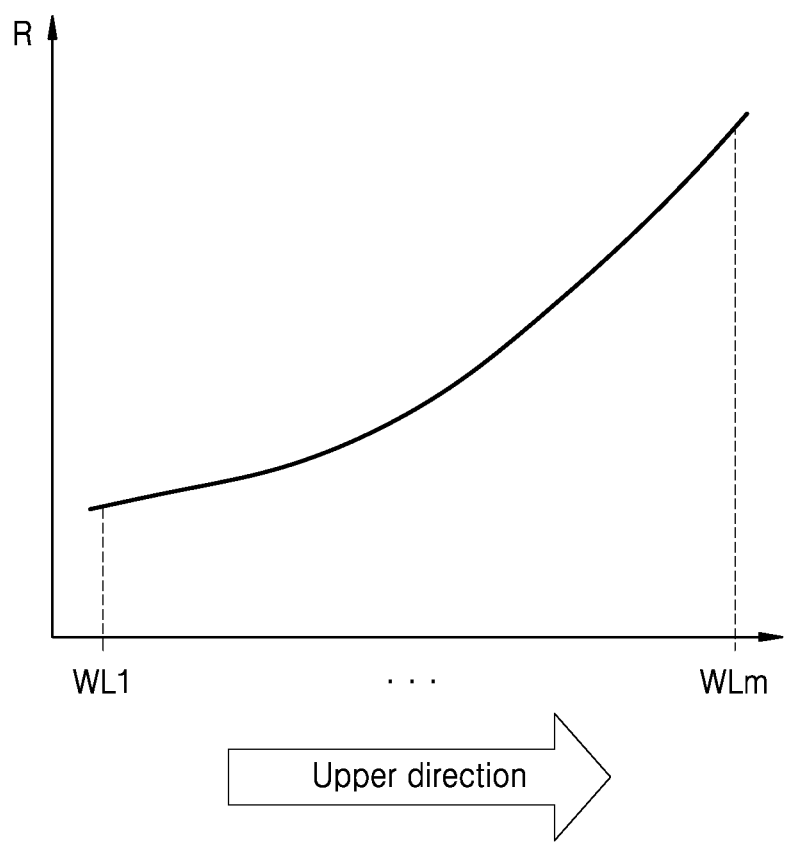
FIG. 7C is a graph showing a tendency of resistance values of a word line.
Figure 7D:
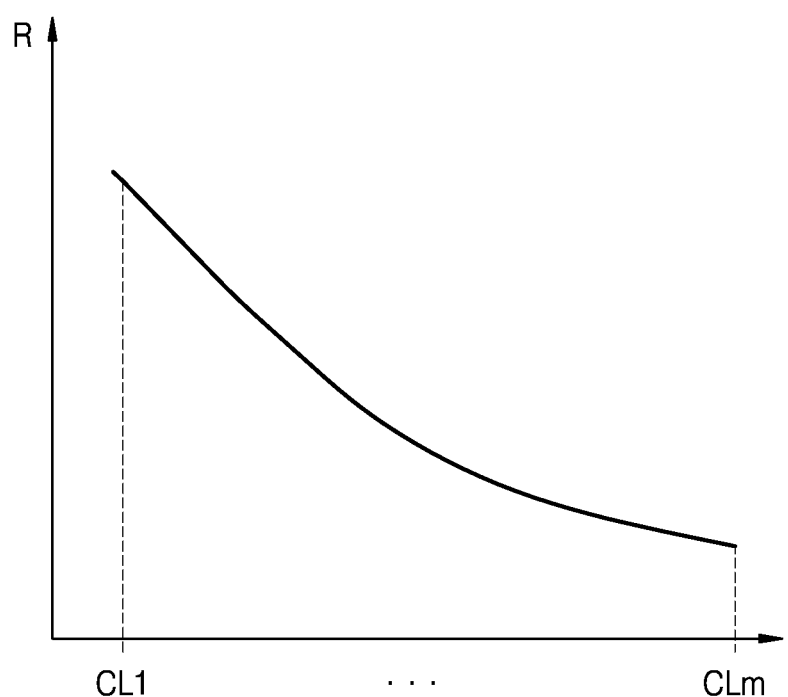
FIG. 7D is a graph showing a tendency of resistance values of a connection wire coupled to the word line.

FIGS. 7A and 7B are diagrams respectively showing plan views along lines A-A' and B-B' of FIG. 5, FIG. 7C is a graph showing a tendency of resistance values of a word line, and FIG. 7D is a graph showing a tendency of resistance values of a connection wire coupled to the word line.

Referring to FIGS. 5, 7A, and 7B, the vertical semiconductor pillars VP may penetrate through a first word line WL1 and an m-th word line WLm, wherein a width W1 of a vertical semiconductor pillar VP penetrating through the first word line WL1 may be smaller than a width W2 of a vertical semiconductor pillar VP penetrating the m-th word line WLm. Therefore, since the remaining region of the first word line WL1 other than a region penetrated by the vertical semiconductor pillar VP is larger than the remaining region of the m-th word line WLm other than a region penetrated by the vertical semiconductor pillar VP, the resistance value of the m-th word line WLm may be greater than that of the first word line WL1.

Referring to FIG. 7C, due to the structural characteristics of the vertical semiconductor pillar VP that is increasingly more narrow in the downward direction, the resistance value of word lines may increase from the first word line WL1 to the m-th word line WLm. In other words, upper word lines may exhibit higher resistance values. In consideration of the tendency of the resistance values of the word line, the resistance value of a connection wire may be implemented as shown in FIG. 7D.

Referring to FIG. 7D, the resistance value of a connection wire coupled to an upper word line may be smaller than the resistance value of a connection wire coupled to a lower word line. In other words, a word line having a large resistance value may be coupled to a connection wire having a small resistance value. Through the connection between connection wires and word lines as described above, the total resistance of lines may be adjusted uniformly.

Based on the graphs of FIGS. 7C and 7D, word lines to be coupled to merge pass transistors may be determined. Detailed descriptions thereof will be given below with reference to FIG. 8.

FIG. 8 is a table showing conditions of word lines to which merge pass transistors are coupled according to example embodiments of the inventive concept. Hereinafter, as shown in FIG. 8, 'M' denotes the number of merged word lines (or the number of merge pass transistors), 'N' denotes the number of word lines (e.g., the number of word lines in FIG. 5 is m), 'K' denotes a reference value, and 'j' denotes an integer. For convenience of explanation, it will be assumed that 'K' is 2.

Referring to FIG. 8, word lines (hereinafter, referred to as target word lines) to which merge pass transistors are to be coupled may be determined primarily based on resistance values of the word lines. For example, when 'M' is equal to or less than 'N/2', the resistance value of a target word line $WL_{M\_PT_j}$ may be set to satisfy a condition to be equal to or greater than the resistance value of an 'N/2'-th word line $WL_{N/2}$. The resistance value of the 'N/2'-th word line $WL_{N/2}$ may correspond to a condition for determining a target word line. In other words, the target word line $WL_{M\_PT_j}$ may be any one of word lines disposed above the 'N/2'-th word line $WL_{N/2}$ based on the structure of the memory device 200 of FIG. 5.

In another example, when 'M' exceeds 'N/2', the number A1 of target word lines having resistance values equal to or greater than the resistance value of the 'N/2'-th word line $WL_{N/2}$ may be set to satisfy a condition to be greater than the number A2 of target word lines having resistance values less than the resistance value of the 'N/2'-th word line $WL_{N/2}$.

Next, target word lines may be determined based on the resistance value of connection wires. For example, when 'M' is equal to or less than 'N/2', a half of the resistance value (i.e., R/2) of a connection wire $CL_{M\_PT_j}$ (which is hereinafter referred to as a target connection wire) extended to be coupled to the target word line $WL_{M\_PT_j}$ (for example, a connection wire for the merge pass transistor M_PT of FIG. 6A includes z-th connection wires CLz_CA1 and CLz_CA2) may satisfy a condition to be less than or equal to the resistance value of a connection wire CLN/2 (for example, a connection wire $CL_{N/K}$ corresponds to a connection wire CLy_CA1 coupled to a y-th word line WLy_CA1 when the y-th word line WLy_CA1 of FIG. 6A is the 'N/2'-th word line $WL_{N/2}$) extended to be coupled to the 'N/2'-th word line $WL_{N/2}$. The resistance value of the connection wire $CL_{N/2}$ extended to be coupled to the 'N/2'-th word line $WL_{N/2}$ may correspond to a criterion for determining a target word line.

In another example, when 'M' exceeds 'N/2', the number B1 of the target connection wires $CL_{M\_PT}$ of which half of the corresponding resistance values (i.e., R/2) are less than or equal to the resistance value of the connection wire CLN/2 extended to be coupled to the 'N/2'-th word line $WL_{N/2}$ satisfies a condition to be greater than the number B2 of the target connection wires $CL_{M\_PT}$ of which half of the corresponding resistance values are greater than the resistance value of the connection wires CLN/2 extended to be coupled to the 'N/2'-th word line $WL_{N/2}$.

However, the conditions of word lines to be coupled to merge pass transistors described above with reference to FIG. 8 are merely examples and are not limited thereto. Various embodiments may be applied thereto according to the memory stack structure of a memory device (or the form of vertical semiconductor pillars included in a memory stack).

Figure 9A:
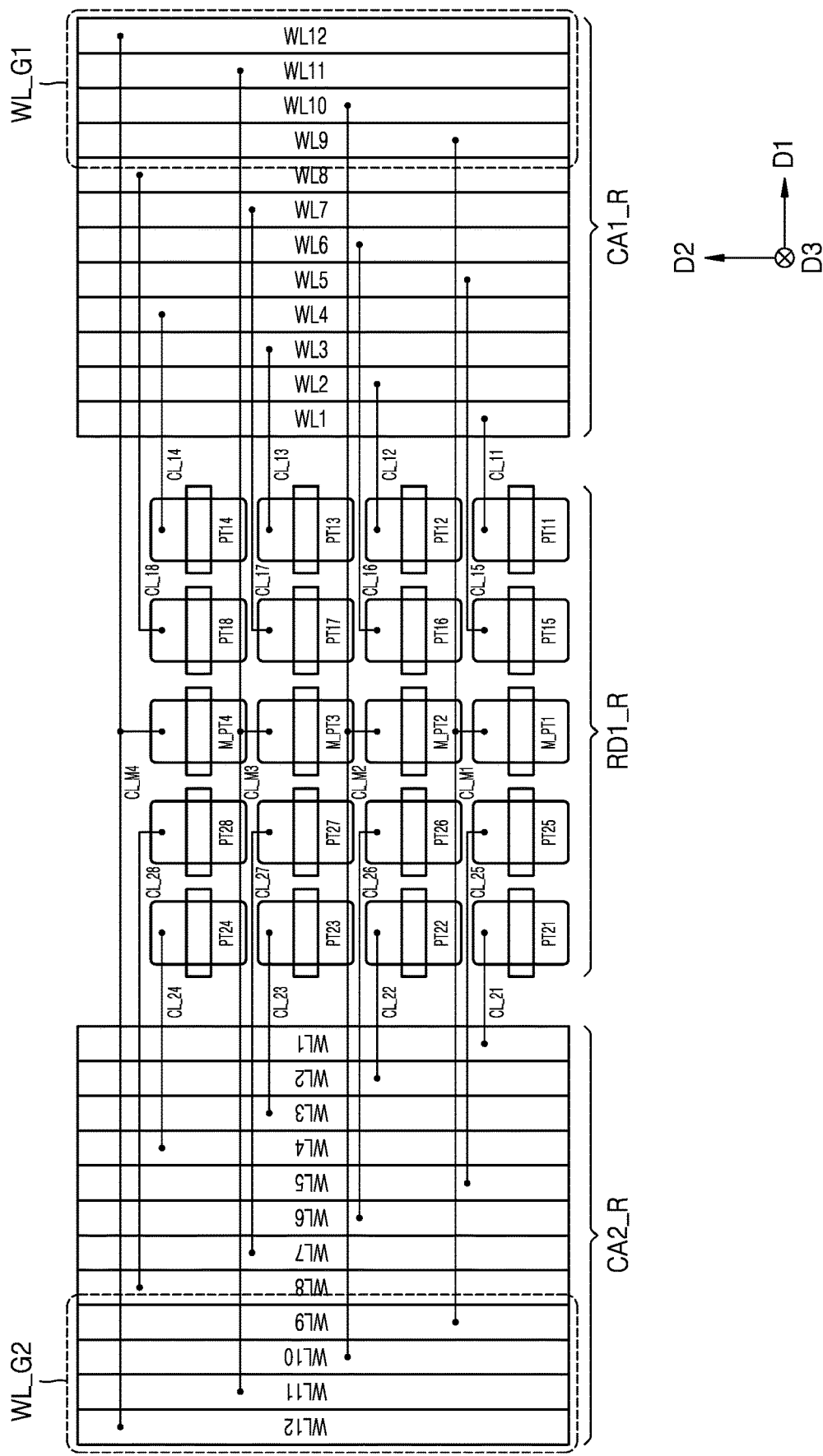
FIGS. 9A and 9B are diagrams for describing a connection structure of a plurality of merge pass transistors and a plurality of pass transistors to word lines according to example embodiments of the inventive concept.
Figure 9B:
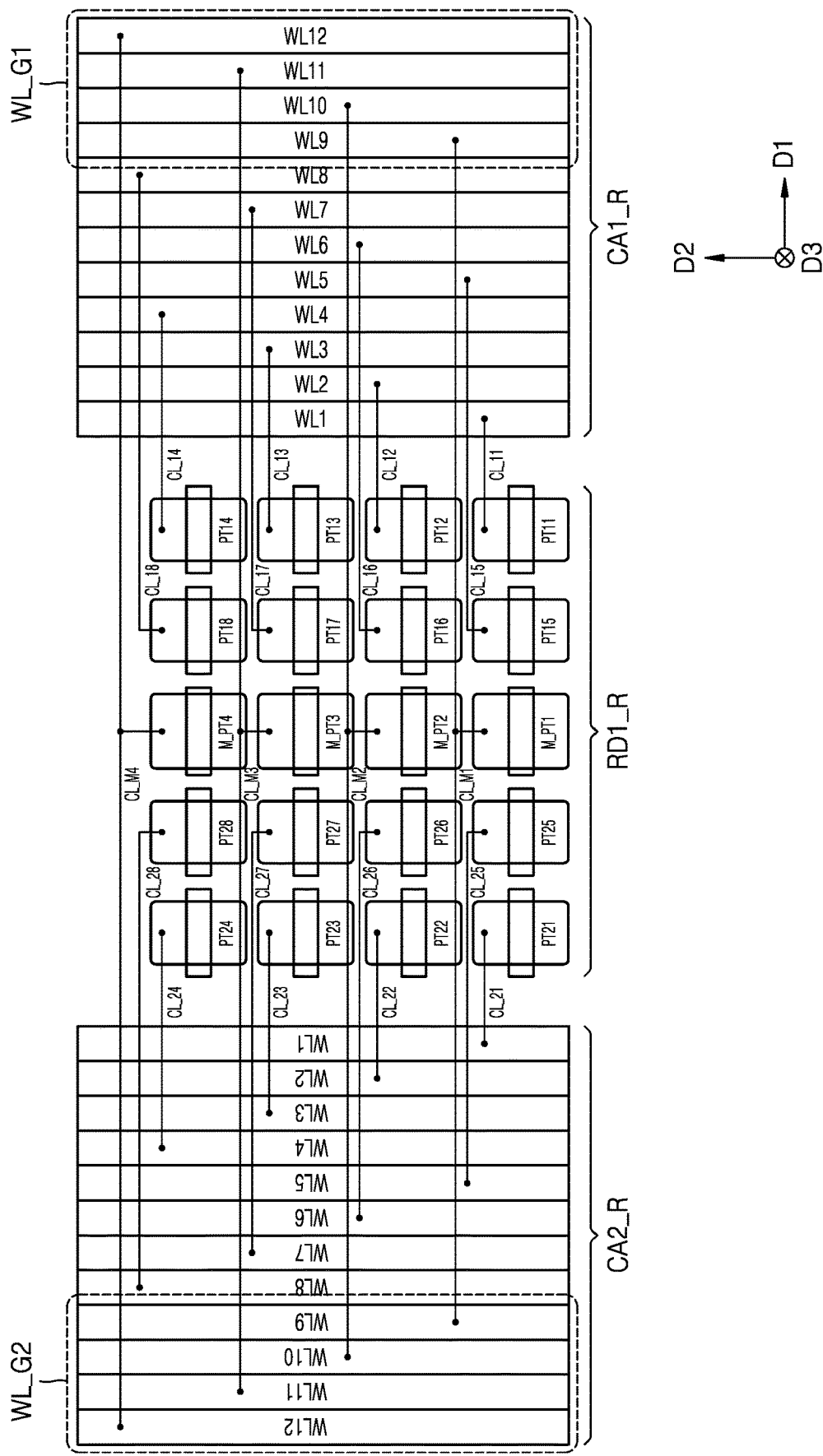

FIGS. 9A and 9B are diagrams for describing a connection structure of a plurality of merge pass transistors and a plurality of pass transistors to word lines according to example embodiments of the inventive concept.

Referring to FIG. 9A, a first memory cell array including first to twelfth word lines WL1 to WL12 may be disposed in the first memory cell array region CA1_R, and a second memory cell array including first to twelfth word lines WL1 to WL12 may be disposed in the second memory cell array region CA2_R. For example, the first memory cell array and the second memory cell array may each have a structure including one memory stack. As described with reference to FIGS. 7A and 7B, regarding the first to twelfth word lines WL1 to WL12, the twelfth word line WL12 may be farther away from the substrate in the vertical direction (i.e., the third direction D3) than the first word line WL1, and upper word lines may exhibit greater resistance values. For example, the second word line WL2 is farther away from the substrate in the vertical direction than the first word line WL1 and the resistance value of a second word line WL2 is greater than the resistance value of the first word line WL1.

First to fourth merge pass transistors M_PT1 to M_PT4 and first to sixteenth pass transistors PT11 to PT18 and PT21 to PT28 may be arranged in the first row decoder region RD1_R between the first memory cell array region CA1_R and the second memory cell array region CA2_R. First to fourth pass transistors PT11 to PT14 arranged closest to the first memory cell array region CA1_R may be coupled to first to fourth word lines WL1 to WL4 through connection wires CL_11 to CL_14, respectively. Fifth to eighth pass transistors PT15 to PT18 arranged second most closest to the first memory cell array region CA1_R may be coupled to fifth to eighth word lines WL5 to WL8 through connection wires CL_15 to CL_18, respectively.

Ninth to twelfth pass transistors PT21 to PT24 arranged closest to the second memory cell array region CA2_R may be coupled to the first to fourth word lines WL1 to WL4 through connection wires CL_21 to CL_24, respectively. Thirteenth to sixteenth pass transistors PT25 to PT28 arranged second most closest to the second memory cell array region CA2_R may be coupled to the fifth to eighth word lines WL5 to WL8 through connection wires CL_25 to CL_28, respectively.

The first to fourth merge pass transistors M_PT1 to M_PT4 may be arranged between a region where first to eighth pass transistors PT11 to PT18 are arranged and a region where ninth to sixteenth pass transistors PT21 to PT28 are arranged. The first to fourth merge pass transistors M_PT1 to M_PT4 may be coupled to ninth to twelfth word lines WL9 to WL12 of each of the first memory cell array and the second memory cell array through connection wires CL_M1 to CL_M4, respectively. In other words, in one memory stack, the first to fourth merge pass transistors M_PT1 to M_PT4 may be coupled to upper word lines of the first memory cell array and the second memory cell array, and the first to sixteenth pass transistors PT11 to PT18 and PT21 to PT28 may be coupled to lower word lines of first memory cell array or the second memory cell array.

Word lines WL9 to WL12 of the first memory cell array coupled to the first to fourth merge pass transistors M_PT1 to M_PT4 may be referred to as a first word line group WL_G1, and word lines WL9 to WL12 of the second memory cell array coupled to the first to fourth merge pass transistors M_PT1 to M_PT4 may be referred to as a second word line group WL_G2. The word lines WL9 to WL12 included in the first word line group WL_G1 may be merged with the word lines WL9 to WL12 included in the second word line group WL_G2, respectively.

The first word line group WL_G1 and the second word line group WL_G2 may include the word lines WL9 to WL12 successively arranged in the vertical direction. Also, the first word line group WL_G1 and the second word line group WL_G2 may satisfy the target word line condition based on the resistance values of word lines of FIG. 8. However, this is merely an example, and the first word line group WL_G1 and the second word line group WL_G2 may include word lines arranged irregularly while meeting the target word line condition of FIG. 8.

Also, the connection wires CL_M1 to CL_M4 extending in the horizontal direction to connect the first to fourth merge pass transistors M_PT1 to M_PT4 to the ninth to twelfth word lines WL9 to WL12 may have a symmetrical structure. For example, the length of a connection wire extending in the first horizontal direction D1 toward the first memory cell array from among connection wires CL_M1 coupled to the first merge pass transistors M_PT1 may be the same as the length of a connection wire extending in the first horizontal direction D1 toward the second memory cell array from among the connection wires CL_M1. The connection wires CL_M1 to CL_M4 may satisfy the target word line condition based on the resistance values of connection wires of FIG. 8.

Referring to FIG. 9B, as compared to FIG. 9A, the first to fourth merge pass transistors M_PT1 to M_PT4 may include gates having an extended width to secure higher gain or driving performance than that of the other pass transistors PT11 to PT18 and PT21 to PT28. Also, the embodiments described with reference to FIGS. 6C and 6D may be applied to the first to fourth merge pass transistors M_PT1 to M_PT4.

Since the embodiments shown in FIGS. 9A and 9B are merely examples, the inventive concept is not limited thereto, and merge pass transistors and pass transistors may be arranged in various ways to meet the condition of FIG. 8.

Figure 10C:
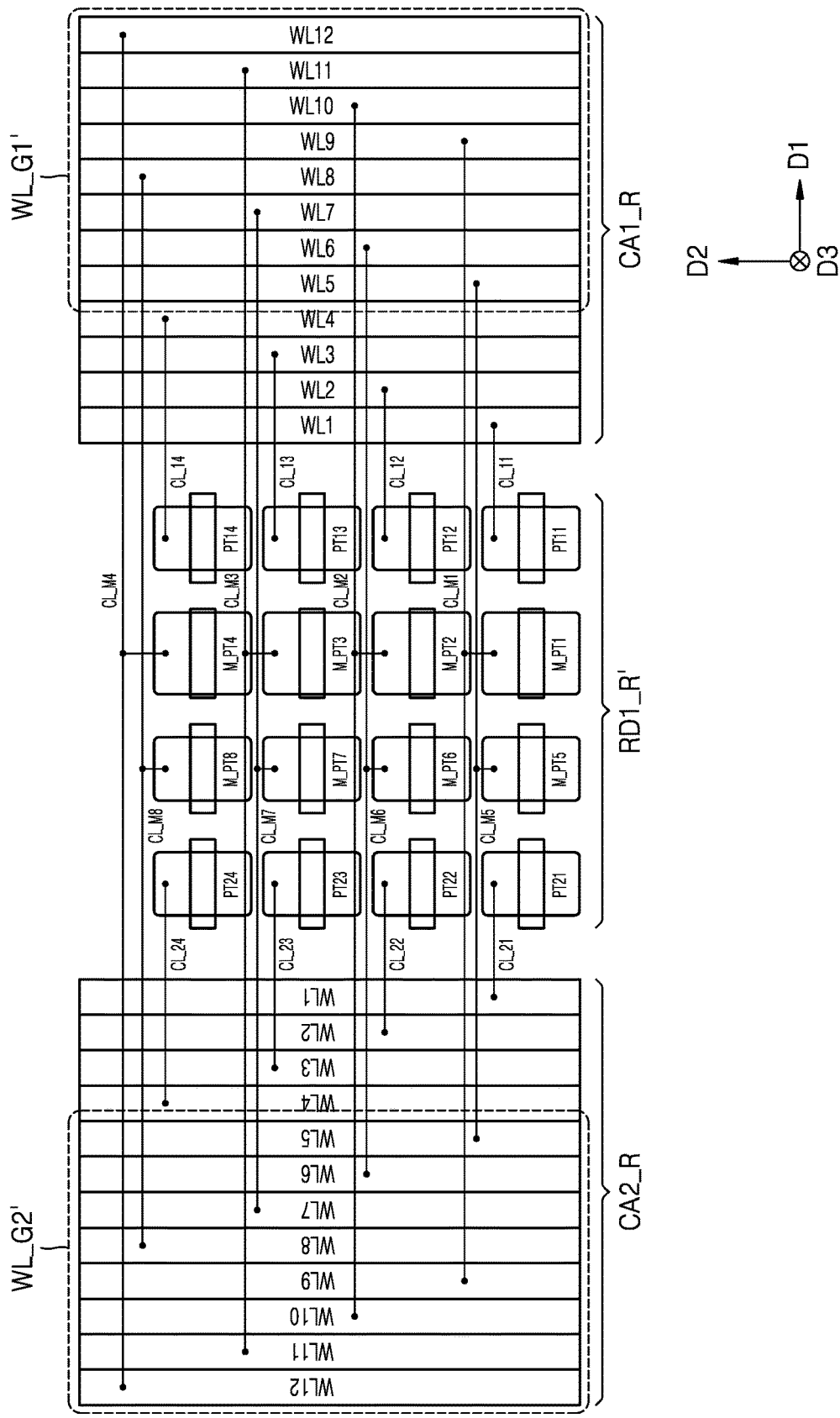

FIGS. 10A to 10C are diagrams for describing a connection structure of a plurality of merge pass transistors and a plurality of pass transistors to word lines according to example embodiments of the inventive concept.

Referring to FIG. 10A, a first memory cell array including first to twelfth word lines WL1 to WL12 may be disposed in the first memory cell array region CA1_R, and a second memory cell array including first to twelfth word lines WL1 to WL12 may be disposed in the second memory cell array region CA2_R. Details of the first memory cell array and the second memory cell array have been described above with reference to FIG. 9A, and thus descriptions identical thereto will be omitted.

First to eighth merge pass transistors M_PT1 to M_PT8 and first to eighth pass transistors PT11 to PT14 and PT21 to PT24 may be arranged in a first row decoder region RD1_R' between the first memory cell array region CA1_R and the second memory cell array region CA2_R. First to fourth pass transistors PT11 to PT14 arranged closest to the first memory cell array region CA1_R may be coupled to first to fourth word lines WL1 to WL4 through connection wires CL_11 to CL_14, respectively. Fifth to eighth pass transistors PT21 to PT24 arranged closest to the second memory cell array region CA2_R may be coupled to the first to fourth word lines WL1 to WL4 through the connection wires CL_21 to CL_24, respectively.

The first to eighth merge pass transistors M_PT1 to M_PT8 may be arranged between a region where first to fourth pass transistors PT11 to PT14 are arranged and a region where fifth to eighth pass transistors PT21 to PT24 are arranged. The first to eighth merge pass transistors M_PT1 to M_PT8 may be coupled to fifth to twelfth word lines WL5 to WL12 of each of the first memory cell array and the second memory cell array through connection wires CL_M1 to CL_M8, respectively. In other words, in one memory stack, the first to eighth merge pass transistors M_PT1 to M_PT8 may be coupled to upper word lines of the first memory cell array and the second memory cell array, and the first to eighth pass transistors PT11 to PT14 and PT21 to PT24 may be coupled to lower word lines of first memory cell array or the second memory cell array.

Word lines WL5 to WL12 of the first memory cell array coupled to the first to eighth merge pass transistors M_PT1 to M_PT8 may be referred to as a first word line group WL_G1', and word lines WL5 to WL12 of the second memory cell array coupled to the first to eighth merge pass transistors M_PT1 to M_PT8 may be referred to as a second word line group WL_G2'. The word lines WL5 to WL12 included in the first word line group WL_G1' may be merged with the word lines WL5 to WL12 included in the second word line group WL_G2', respectively.

The first word line group WL_G1' and the second word line group WL_G2' may include the word lines WL5 to WL12 successively arranged in the vertical direction. Also, the first word line group WL_G1' and the second word line group WL_G2' may satisfy the target word line condition based on the resistance values of word lines of FIG. 8. However, this is merely an example, and the first word line group WL_G1' and the second word line group WL_G2' may include word lines arranged irregularly while meeting the target word line condition of FIG. 8.

Also, the connection wires CL_M1 to CL_M8 extending in the horizontal direction to connect the first to eighth merge pass transistors M_PT1 to M_PT8 to the fifth to twelfth word lines WL5 to WL12 may have an asymmetrical structure. For example, the length of a connection wire extending in the first horizontal direction D1 toward the first memory cell array from among connection wires CL_M1 coupled to the first merge pass transistors M_PT1 may be different from the length of a connection wire extending in the first horizontal direction D1 toward the second memory cell array from among the connection wires CL_M1. The connection wires CL_M1 to CL_M8 may satisfy the target word line condition based on the resistance values of connection wires of FIG. 8.

Referring to FIG. 10B, as compared to FIG. 10A, the first to eighth merge pass transistors M_PT1 to M_PT8 may include gates having extended width to secure higher gain or driving performance than that of the other pass transistors PT11 to PT14 and PT21 to PT24. Also, the embodiments described with reference to FIGS. 6C and 6D may be applied to the first to eighth merge pass transistors M_PT1 to M_PT8.

Referring to FIG. 10C, as compared to FIG. 10B, some merge pass transistors M_PT1 to M_PT4 may include gates having extended width to secure higher gain or driving performance than that of the other pass transistors PT11 to PT14 and PT21 to PT28. Also, the embodiments described with reference to FIGS. 6C and 6D may be applied to the some merge pass transistors M_PT1 to M_PT4. The remaining merge merge pass transistors M_PT5 to M_PT8 may have the same gain or driving performance as that of the other pass transistors PT11 to PT14 and PT21 to PT28.

Since the embodiments shown in FIGS. 10A to 10C are merely examples, the inventive concept is not limited thereto, and merge pass transistors and pass transistors may be arranged in various ways to meet the condition of FIG. 8.

Figure 11:
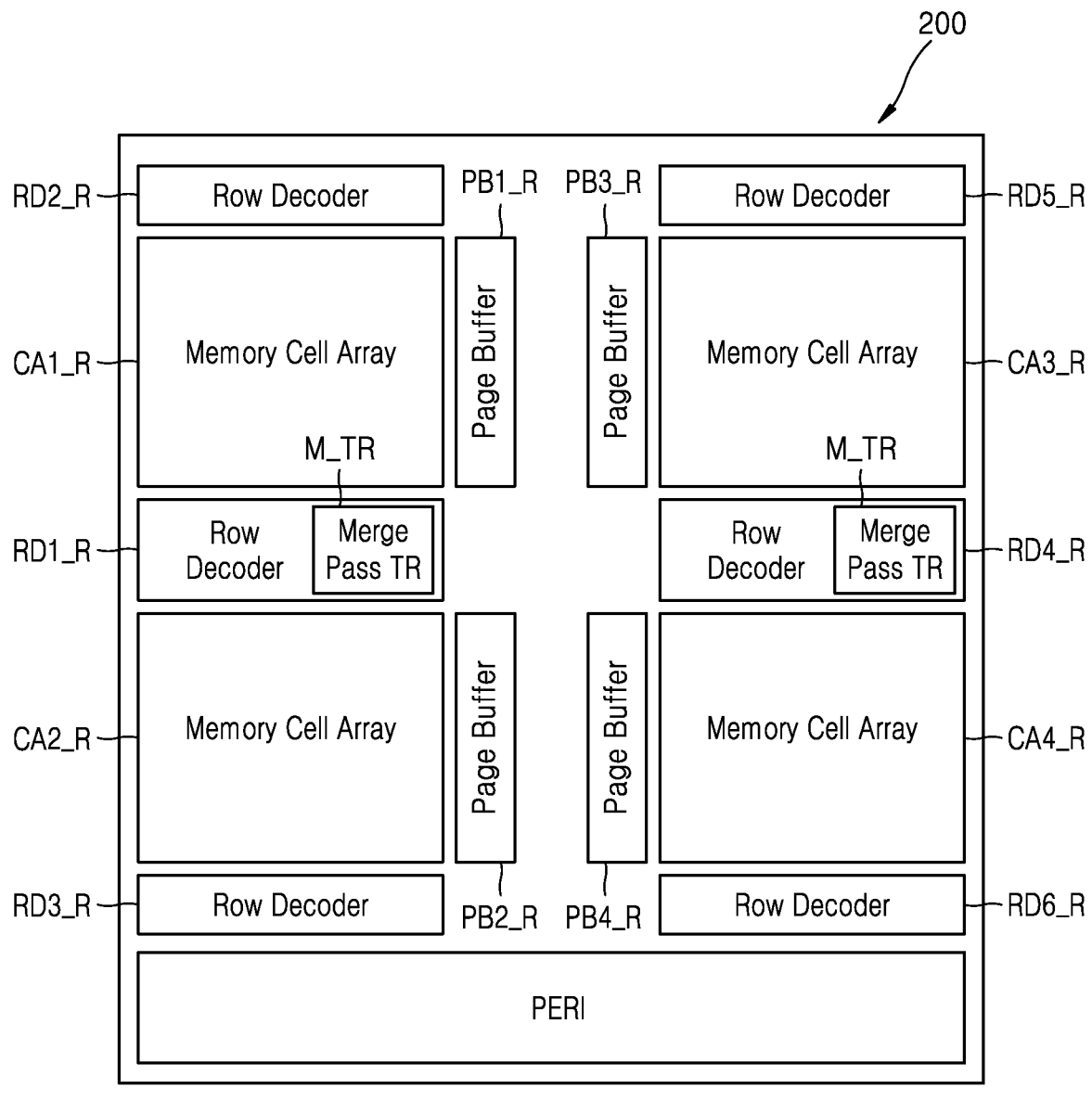
FIG. 11 is a layout diagram for describing an arrangement of row decoders included in a memory device according to an example embodiment of the inventive concept.

FIG. 11 is a layout diagram for describing an arrangement of row decoders included in a memory device 200 according to an example embodiment of the inventive concept.

Referring to FIG. 11, the memory device 200 may be implemented on a semiconductor chip, and the semiconductor chip may include memory cell array regions CA1_R to CA4_R, row decoder regions RD1_R to RD6_R, page buffer regions PB1_R to PB4_R, and the peripheral circuit region PERI_R. The row decoder regions RD1_R to RD6_R may be adjacent to memory cell array regions CA1_R to CA4_R in the second horizontal direction D2, and row decoders may be arranged in the row decoder regions RD1_R to RD6_R. The page buffer regions PB1_R to PB4_R may be arranged adjacent to the memory cell array regions CA1_R to CA4_R in the first horizontal direction D1. A plurality of page buffers may be disposed in the page buffer regions PB1_R to PB4_R.

The memory cell array regions CA1_R to CA4_R, the row decoder regions RD1_R to RD6_R, and the page buffer regions PB1_R to PB4_R may be arranged in parallel with one another in a direction parallel to the top surface of the substrate. Components including a data input/output circuit may be disposed in the peripheral circuit region PERI_R.

A plurality of merge pass transistors M_TR to which the example embodiments of the inventive concept are applied may be arranged in the first row decoder region RD1_R between the first memory cell array region CA1_R and the second memory cell array region CA2_R. Also, the merge pass transistors M_TR to which the example embodiments of the inventive concept are applied may be arranged in a fourth row decoder region RD4_R between a third memory cell array region CA3_R and a fourth memory cell array region CA4_R.

Figure 12:
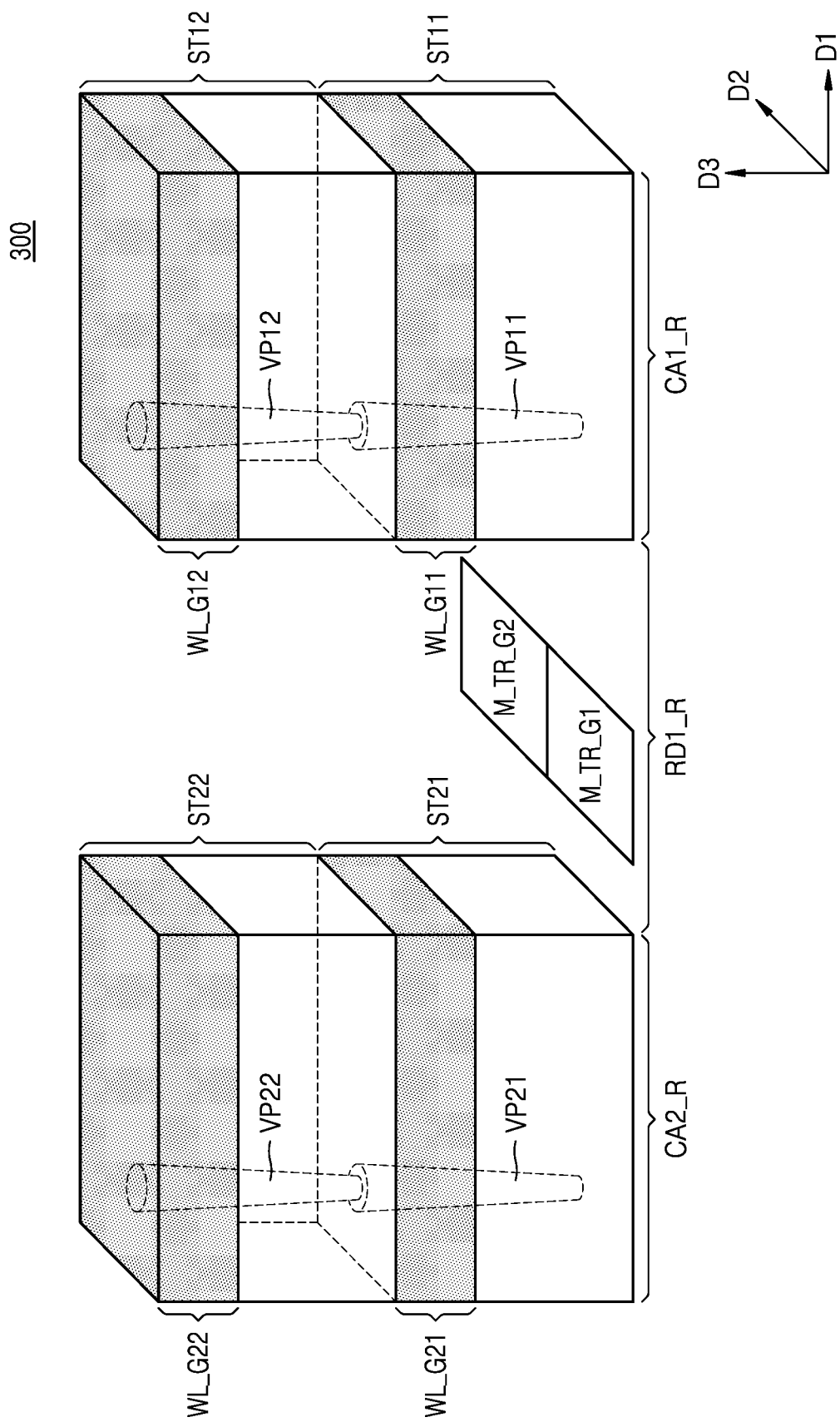
FIG. 12 is a diagram for describing a memory device according to an example embodiment of the inventive concept.

FIG. 12 is a diagram for describing a memory device 300 according to an example embodiment of the inventive concept.

Referring to FIG. 12, the memory device 300 may include a first memory cell array disposed in the first memory cell array region CA1_R, a second memory cell array disposed in the second memory cell array region CA2_R, and a first merge pass transistor group M_TR_G1 and a second merge pass transistor group M_TR_G2 arranged in the first row decoder region RD1_R.

The first memory cell array may include a first electrode structure ST11 and a second electrode structure ST12 as a multi-memory stack structure. The second memory cell array may include a third electrode structure ST21 and a fourth electrode structure ST22 as a multi-memory stack structure. Each of first to fourth electrode structures ST11 to ST22 may include at least one vertical semiconductor pillar VP11 to VP22. The first merge pass transistor group M_TR_G1 may be coupled to a first word line group WL_G11 including upper word lines from among word lines of the first electrode structure ST11 and a third word line group WL_G21 including upper word lines from among word lines of the third electrode structure ST21. The second merge pass transistor group M_TR_G2 may be coupled to a second word line group WL_G12 including upper word lines from among word lines of the third electrode structure S211 and a fourth word line group WL_G22 including upper word lines from among word lines of the fourth electrode structure ST22.

The first word line group WL_G11 and the third word line group WL_G21 may satisfy the condition shown in FIG. 8 in memory stacks corresponding to the first electrode structure ST11 and the third electrode structure ST21. Also, the second word line group WL_G12 and the fourth word line group WL_G22 may satisfy the condition shown in FIG. 8 in memory stacks corresponding to the second electrode structure ST12 and the fourth electrode structure ST22.

The second word line group WL_G12 may be located a predetermined distance apart from the first word line group WL_G11 in the third direction D3, and the fourth word line group WL_G22 may be located a predetermined distance apart from the third word line group WL_G21 in the third direction D3.

Without being limited to the embodiment shown in FIG. 12, the first memory cell array and the second memory cell array may further include electrode structures corresponding to more memory stacks, and merge pass transistor groups coupled to word lines may be further arranged in the first row decoder region RD1_R to correspond to the condition shown in FIG. 8.

Figure 13:
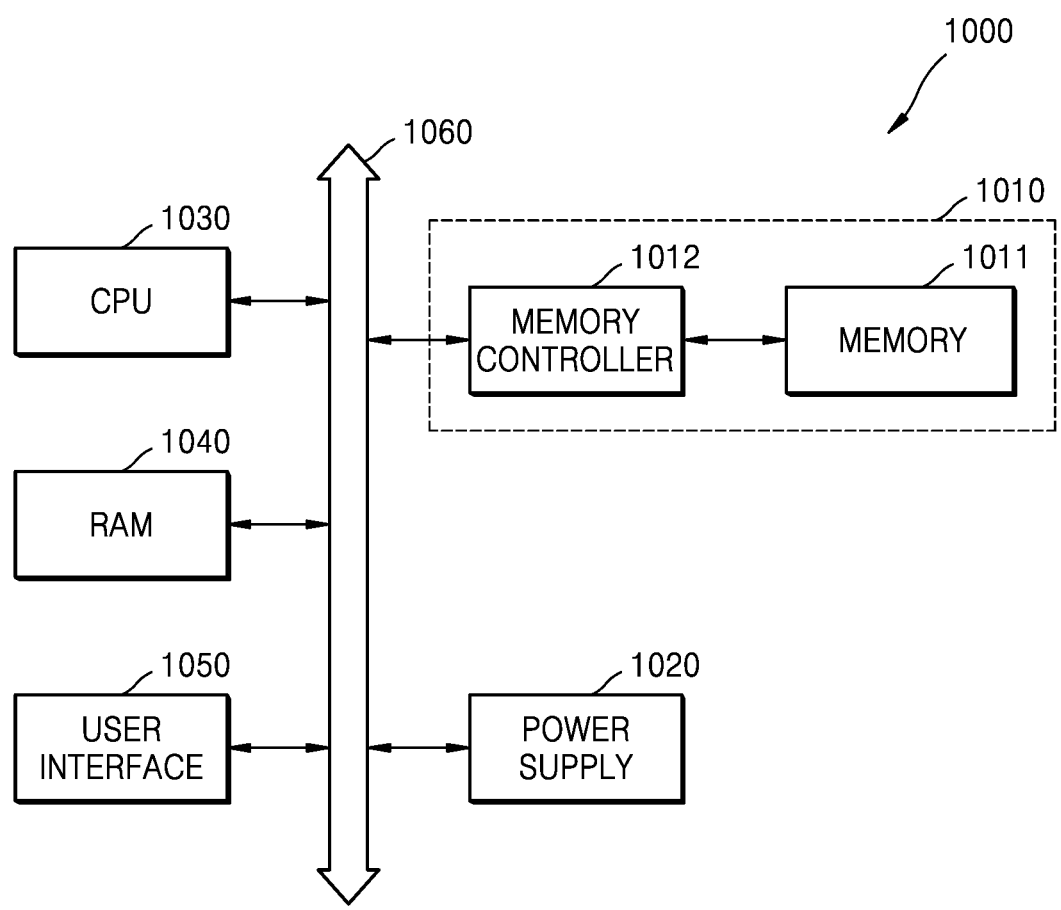
FIG. 13 is a diagram showing a computing system device including a memory system according to an example embodiment of the inventive concept.

FIG. 13 is a diagram showing a computing system device 1000 including a memory system 1010 according to an example embodiment of the inventive concept.

Referring to FIG. 13, the computing system device 1000 may include a CPU 1030, a user interface 1050, and the memory system 1010 including a memory controller 1012 and a memory device 1011, wherein the CPU 1030, the user interface 1050, and the memory system 1010 are electrically coupled to a bus 1060.

The memory device 1011 may include merge pass transistors to which example embodiments of the inventive concept are applied. Therefore, the size of the memory device 1011 may be reduced, and thus the size of the memory system 1010 may also be reduced.

The computing system device 1000 may further include a RAM 1040 and a power supply 1020. For example, when the computing system device 1000 is a mobile device, a battery for supplying an operating voltage of the computing system 1010 and a modem like a baseband chipset may be additionally provided. Also, it would be obvious to one of ordinary skill in the art that the computing system device 1000 may further include an application chipset, a camera image processor (CIS), a mobile DRAM, and the like, and thus detailed descriptions thereof will be omitted.

The memory controller 1012 and the non-volatile memory device 1011 may constitute, for example, a solid state drive/disk (SSD) that uses a non-volatile memory to store data.

While the inventive concept has been particularly shown and described with reference to embodiments thereof, it will be understood that various changes in form and details may be made therein without departing from the spirit and scope of the following claims.

What is claimed is:

1. A memory device comprising:
a substrate including a top surface;
a first memory cell array comprising first memory cells stacked vertically on a first memory cell array region of the top surface of the substrate;
a second memory cell array comprising second memory cells stacked vertically on a second memory cell array region of the top surface of the substrate;
first word lines coupled to the first memory cells, the first word lines including a subset of first word lines and remaining first word lines;
second word lines coupled to the second memory cells, the second word lines including a subset of second word lines and remaining second word lines; and
a row decoder comprising a plurality of merge pass transistors, each of the plurality of merge pass transistors commonly connected to a respective one of the subset of first word lines and a respective one of the subset of second word lines, and the row decoder disposed in a row decoder region of the top surface of the substrate between the first memory cell array region and the second memory cell array region.

2. The memory device of claim 1, wherein the respective one of the subset of first word lines and the respective one of the subset of second word lines extend horizontally at a same height over the top surface of the substrate.

3. The memory device of claim 1, wherein the row decoder further comprises:
a plurality of first pass transistors respectively coupled to the remaining first word lines; and
a plurality of second pass transistors respectively coupled to the remaining second word lines.

4. The memory device of claim 3, wherein the row decoder region comprises:
a first region adjacent the first memory cell array region and having arranged therein the first pass transistors;
a second region adjacent the second memory cell array region and having arranged therein the second pass transistors; and
a third region located between the first region and the second region, the third region having arranged therein the merge pass transistors.

5. The memory device of claim 3, wherein a gain of each of the merge pass transistors is greater than a gain of each of the first pass transistors and a gain of each of the second pass transistors.

6. The memory device of claim 3, wherein at least one of a gate width and a gate length of each of the merge pass transistors is different than at least one of a gate width and a gate length of each the first pass transistors and a gate width and a gate length of each of the second pass transistors.

7. The memory device of claim 1, wherein the subset of first word lines comprise at least one first word line group each comprising word lines successively arranged in a vertical direction and coupled to the merge pass transistors, and
the subset of second word lines comprise at least one second word line group each comprising word lines successively arranged in a vertical direction and coupled to the merge pass transistors.

8. The memory device of claim 1, wherein any one of the merge pass transistors is coupled to a first connection wire extending in a horizontal direction toward the first memory cell array to be coupled to any one of the subset of the first word lines, and a second connection wire extending in a horizontal connection toward to the second memory cell array to be coupled to any one of the subset of the second word lines, and
a length of the first connection wire is identical to a length of the second connection wire.

9. The memory device of claim 1, further comprising first connection wires and second connection wires extending in a horizontal direction,
wherein each of the merge pass transistors is coupled to a respective one of the first connection wires extending toward the first memory cell array to be coupled to any one of the subset of first word lines and a respective one of the second connection wires extending toward the second memory cell array to be coupled to any one of the subset of second word lines, and
a length of the respective one of first connection wires is different than a length of the respective one of second connection wires.

10. The memory device of claim 1, wherein the row decoder is electrically connected to the first memory cell array and the second memory cell array simultaneously through the merge pass transistors.

11. A memory device comprising:
a substrate having a top surface;
a first memory cell array comprising a first memory stack comprising first memory cells stacked vertically on a first memory cell array region of the top surface of the substrate;

a second memory cell array comprising a second memory stack comprising second memory cells stacked vertically on a second memory cell array region of the top surface of the substrate;

first word lines coupled to the first memory cells, the first word lines including a subset of first word lines and remaining first word lines;

second word lines coupled to the second memory cells, the second word lines including a subset of second word lines and remaining second word lines;

a plurality of first merge pass transistors arranged in a region between the first memory cell array region and the second memory cell array region, each of the plurality of first merge pass transistors commonly connected to a respective one of the subset of first word lines and a respective one of the subset of second word lines;

a plurality of first pass transistors arranged adjacent to the first memory cell array region and respectively coupled to the remaining first word lines; and a plurality of second pass transistors arranged adjacent to the second memory cell array region and respectively coupled to the remaining second word lines.

12. The memory device of claim 11, wherein the first word lines are stacked vertically and the second word lines are stacked vertically, wherein the first and second word lines from among the subset of first word lines and the subset of second word lines to which the first merge pass transistors are respectively connected have resistance values equal to or greater than a resistance value of a reference word line positioned in a middle of a vertical stack of the first word lines or a vertical stack of the second word lines.

13. The memory device of claim 11, wherein the first word lines are stacked vertically and the second word lines are stacked vertically, wherein a number of first merge pass transistors from among the first merge pass transistors coupled to word lines from among the subset of first word lines and the subset of second word lines having resistance values equal to or greater than a reference value is greater than a number of first merge pass transistors from among the first merge pass transistors coupled to word lines from among the subset of first word lines and the subset of second word lines having resistance values less than the reference value, and the reference value corresponds to a resistance value of a reference word line positioned in a middle of a vertical stack of the first word lines or a vertical stack of the second word lines.

14. The memory device of claim 11, wherein the word lines from among the subset of first word lines and the subset of second word lines to which the first merge pass transistors are respectively coupled comprise upper word lines successively arranged in a vertical direction from a first reference word line from among the first word lines and upper word lines successively arranged in the vertical direction from a second reference word line from among the second word lines.

15. The memory device of claim 11, wherein the first word lines are stacked vertically and the second word lines are stacked vertically, wherein the first merge pass transistors are coupled to the subset of first word lines by first connection wires and to the subset of second word lines by second connection wires, wherein half of a resistance value of each of the first and second connection wires is less than or equal to a resistance value of a connection wire connected to a reference word line positioned in a middle of a vertical stack of the first word lines or a vertical stack of the second word lines.

16. The memory device of claim 15, wherein a number of connection wires from among the first and second connection wires having resistance values equal to or greater than a reference value is greater than a number of connection wires from among the first and second connection wires having resistance values less than the reference value, and the reference value is twice the resistance value of the connection wire connected to the reference word line.

17. The memory device of claim 11, wherein the first memory cell array further comprises a third memory stack comprising third memory cells stacked vertically on the first memory stack, and the second memory cell array further comprises a fourth memory stack comprising fourth memory cells stacked vertically on the second memory stack, the memory device further comprising:

third word lines coupled to the third memory cells, the third word lines including a subset of third word lines and remaining third word lines;

fourth word lines coupled to the fourth memory cells, the fourth word lines including a subset of fourth word lines and remaining fourth word lines;

a plurality of second merge pass transistors arranged in the region between the first memory cell array region and the second memory cell array region, each of the plurality of second merge pass transistors commonly connected to a respective one of the subset of third word lines and a respective one of the subset of fourth word lines;

a plurality of third pass transistors arranged adjacent to the first memory cell array region and respectively coupled to the remaining third word lines; and a plurality of fourth pass transistors arranged adjacent to the second memory cell array region and respectively coupled to the remaining fourth word lines.

18. The memory device of claim 17, wherein word lines from among the subset of third word lines and the subset of fourth word lines to which the second merge pass transistors are respectively coupled are a certain distance apart from the word lines from among the subset of first word lines and the subset of second word lines to which the first merge pass transistors are respectively coupled in a vertical direction.

19. A memory device comprising:

a substrate including a top surface;

a first memory cell array comprising memory cells stacked vertically on a first memory cell array region on the top surface of the substrate;

a second memory cell array comprising memory cells stacked vertically on a second memory cell array region on the top surface of the substrate;

first word lines and first selection lines coupled to the first memory cell array, the first word lines including a subset of first word lines and remaining first word lines, and the first selection lines including a subset of first selection lines and remaining first selection lines;

second word lines and second selection lines coupled to the second memory cell array, the second word lines including a subset of second word lines and remaining second word lines, and the second selection lines including a subset of second selection lines and remaining second selection lines; and a row decoder comprising a plurality of first merge pass transistors, each of the plurality of first merge pass transistors commonly connected to a respective one of the subset of first word lines and a respective one of the subset of second word lines, and a plurality of second merge pass transistors, each of the plurality of second merge pass transistors commonly connected to a respective one of the subset of first selection lines and a respective one of the subset of second selection lines, and the row decoder disposed in a row decoder region between the first memory cell array region and the second memory cell array region.

20. The memory device of claim 19, wherein the subset of first word lines and the subset of second word lines each comprise at least one dummy word line.

* * * * *